(12) United States Patent
Liou et al.

(10) Patent No.: US 10,725,064 B2
(45) Date of Patent: *Jul. 28, 2020

(54) METHODS OF MOTION PROCESSING AND RELATED ELECTRONIC DEVICES AND MOTION MODULES

(71) Applicant: CM HK LIMITED, Fortress Hill (HK)

(72) Inventors: Shun-Nan Liou, Taipei (TW); Chin-Lung Li, Taipei (TW); Chien-Chih Hsu, Taipei (TW)

(73) Assignee: CM HK LIMITED, Fortress Hill (HK)

(*) Notice: Subject to any disclaimer, the term of this patent is extended or adjusted under 35 U.S.C. 154(b) by 316 days.

This patent is subject to a terminal disclaimer.

(21) Appl. No.: 15/860,762

(22) Filed: Jan. 3, 2018

(65) Prior Publication Data

US 2018/0143217 A1    May 24, 2018

Related U.S. Application Data

(63) Continuation-in-part of application No. 15/357,176, filed on Nov. 21, 2016, now Pat. No. 9,885,734.
(Continued)

(30) Foreign Application Priority Data

May 8, 2013    (CN) .................... 2013 2 0245496 U

(51) Int. Cl.
*G01P 13/00* (2006.01)
*G01C 21/16* (2006.01)
(Continued)

(52) U.S. Cl.
CPC .......... *G01P 13/00* (2013.01); *G01C 19/5776* (2013.01); *G01C 21/16* (2013.01);
(Continued)

(58) Field of Classification Search
CPC ....... G01P 13/00; G01C 21/16; G01C 22/006; G01R 33/02
See application file for complete search history.

(56) References Cited

U.S. PATENT DOCUMENTS 4,965,550 A    10/1990    Wroblewski
5,355,503 A    10/1994    Soffel et al.
(Continued)

OTHER PUBLICATIONS

Soloviev et al., Utilizing Multipath Reflections in Deeply Integrated GPS/INS Architecture for Navigation in Urban Environments, 2008 IEEE, pp. 383-393.
(Continued)

*Primary Examiner* — Toan M Le
(74) *Attorney, Agent, or Firm* — McClure, Qualey & Rodack, LLP

(57) ABSTRACT

Methods of motion processing and related electronic devices and motion modules are provided. A representative method of motion processing of an electronic device, which incorporates a motion sensor and a processor, the motion sensor having sensor circuitry including a sensor clock, the processor having processor circuitry including a processor clock, includes: providing one or more samples, including at least one of an accelerometer sample or a gyroscope sample associated with the electronic device, by the motion sensor at a sampling rate according to the sensor clock; storing each of the one or more samples in a buffer of the motion sensor; fetching the samples in batches from the buffer, by the processor, at a polling rate; and performing, by the processor, a numerical integration according to the sensor clock based on the samples fetched from the buffer.

60 Claims, 10 Drawing Sheets

Related U.S. Application Data which is a continuation-in-part of application No. 14/088,452, filed on Nov. 25, 2013, now Pat. No. 9,534,927, which is a continuation-in-part of application No. 13/945,930, filed on Jul. 19, 2013, now Pat. No. 9,798,390.

(51) Int. Cl.
| | |
|---|---|
| G01P 15/08 | (2006.01) |
| G01R 33/02 | (2006.01) |
| G01C 19/5776 | (2012.01) |
| G01C 22/00 | (2006.01) |
| G01R 33/00 | (2006.01) |

(52) U.S. Cl.
CPC ........ *G01C 22/006* (2013.01); *G01P 15/0802* (2013.01); *G01R 33/0023* (2013.01); *G01R 33/02* (2013.01)

(56) References Cited

U.S. PATENT DOCUMENTS

| | | |
|---|---|---|
| 6,256,746 B1 | 7/2001 | Cheng |
| 6,557,107 B1 | 4/2003 | Kim |
| 7,000,469 B2 | 2/2006 | Foxlin et al. |
| 9,104,417 B2 | 8/2015 | Ye et al. |
| 9,798,390 B2 * | 10/2017 | Ye .................... G06F 3/017 |
| 2007/0113286 A1 | 5/2007 | Cromer et al. |
| 2008/0238772 A1 | 10/2008 | Soloviev et al. |
| 2009/0184849 A1 | 7/2009 | Nasiri et al. |
| 2009/0265671 A1 | 10/2009 | Sachs et al. |
| 2011/0109330 A1 | 5/2011 | Ikuta et al. |
| 2011/0163955 A1 | 7/2011 | Nasiri et al. |
| 2012/0022844 A1 | 1/2012 | Teixeira |
| 2012/0277545 A1 | 11/2012 | Texeira |
| 2014/0136871 A1 | 5/2014 | Jung et al. |

OTHER PUBLICATIONS

Jia, Ning. "Fall Detection Application by Using 3-Axis Accelerometer ADXL345". Analog Devices. AN-1 023 Application Note. Copyright 2009. Availabile: http://iblog.ednch ina.geo.eet-en.com/uploadedn/Biog/2009/7/1/32909b38-5e 12-4a32-bd7 e-19e75256ed35.pdf.

Marquez et al., Motion-Logger: An Attitude and Motion Sensing System, Dec. 12-15, 2011, 2011 50th IEEE conference on Decision and Control and European Control Conference (CDC-ECC), Orlando, FL, pp. 5311-5316.

Wu et al. The Design of an Intelligent Pedometer Using Android, 2011 Second International Conference on Innovations in Bio-Inspired Computing and Applications, pp. 313-315.

* cited by examiner

METHODS OF MOTION PROCESSING AND RELATED ELECTRONIC DEVICES AND MOTION MODULES

CROSS-REFERENCE TO RELATED APPLICATIONS

This application is a continuation-in-part application of and claims the priority benefit of a prior U.S. application Ser. No. 15/357,176, filed on Nov. 21, 2016 now patented as U.S. Pat. No. 9,885,734, issued on Feb. 6, 2018, which is a continuation-in-part application of and claims the priority benefit of a prior U.S. application Ser. No. 14/088,452, filed on Nov. 25, 2013 now patented as U.S. Pat. No. 9,534,927, issued on Jan. 3, 2017, which is a continuation-in-part application of and claims the priority benefit of a prior U.S. application Ser. No. 13/945,930, filed on Jul. 19, 2013 now patented as U.S. Pat. No. 9,798,390, issued on Oct. 24, 2017, and which is also a continuation-in-part application of and claims the priority benefit of a prior U.S. application Ser. No. 14/033,553, filed on Sep. 23, 2013 now patented as U.S. Pat. No. 9,104,417, issued on Aug. 11, 2015. The prior U.S. application Ser. No. 14/033,553 claims the priority benefit of China application serial no. 201320245496.X, filed on May 8, 2013. The entirety of each of the above-mentioned patent applications is hereby incorporated by reference herein and made a part of this specification.

BACKGROUND OF THE INVENTION

1. Field of the Invention

The present application relates to a microcontroller unit (MCU) of a mobile device. More particularly, the present application relates to an MCU including a buffer for storing samples for further processing and/or results of the processing.

2. Description of the Related Art

Nowadays a mobile device is often equipped with embedded sensors, such as accelerometer, gyro-sensor and magnetometer. The central processing unit (CPU) of the mobile device can collect samples generated by the sensors and perform some processing based on the samples. For example, the CPU can calculate the movement and the orientation of the mobile device or calculate how many steps the user of the mobile device has walked.

Since the sensors keep generating samples, the CPU has to receive and analyze the samples constantly. Therefore, the CPU has to be in its full operation mode for extended periods of time, which consumes electric power and shortens the battery life of the mobile device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
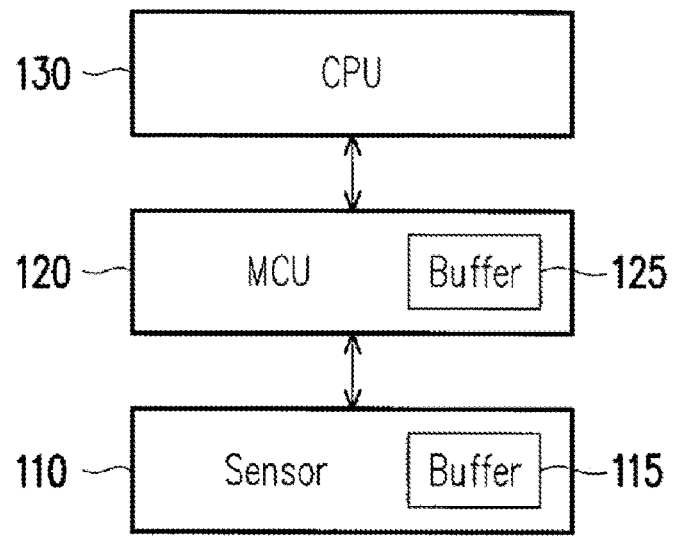
FIG. 1 is a schematic diagram showing a mobile device according to an embodiment of the present application.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram showing a mobile device 100 according to an embodiment of the present application. The mobile device 100 may be a remote controller, a smart phone, a personal digital assistant (PDA), a tablet computer, or a notebook computer, etc. The mobile device 100 includes a sensor 110, an MCU 120, and a CPU 130. The MCU 120 is coupled to the sensor 110. The CPU 130 is coupled to the MCU 120. The sensor 110 includes a buffer 115. The MCU 120 includes a buffer 125. The buffers 115 and 125 are storage devices, such as register or memory.

The sensor 110 generates a plurality of samples. The sensor 110 may store the samples in the buffer 115. The MCU 120 fetches the samples from the sensor 110 and performs an initial preset processing according to the samples to generate one or more results of the initial preset processing. The MCU 120 may store either the samples or the result(s) in the buffer 125. Alternatively, the MCU 120 may store both the samples and the result(s) in the buffer 125.

The CPU 130 fetches the one or more results from the MCU 120 or receives a signal based on the one or more results from the MCU 120. The CPU 130 performs further preset processing according to the one or more results or the signal from the MCU 120.

In an embodiment of the present application, the sensor 110 generates the samples at a frequency $F_1$, which means the sensor 110 generates $F_1$ samples every second. The MCU 120 fetches the samples from the sensor 110 in batches at a frequency $F_2$. The CPU 130 fetches the results from the MCU 120 in batches at a frequency $F_3$. The frequency $F_1$ may be higher than or equal to the frequency $F_2$. The frequency $F_2$ may be higher than or equal to the frequency $F_3$.

For example, $F_1$ may be 2000 Hz, $F_2$ may be 1 Hz, and $F_3$ may be 0.001 Hz. The sensor 110 generates 2000 samples every second. The MCU 120 fetches the samples from the sensor 110 once in every second. In each fetching, the MCU 120 fetches the 2000 samples as a single batch from the sensor 110. After each fetching, the MCU 120 performs the initial preset processing and generates 40 results based on the 2000 samples. The CPU 130 fetches the 40 results as a single batch from the MCU 120 once every 1000 seconds. After each fetching, the CPU 130 performs further preset processing according to the 40 results. This batch fetching mechanism alleviates the burden of obtaining samples of the MCU 120 because the MCU 120 does not have to fetch the samples one by one from the sensor 110. Similarly, this batch fetching mechanism alleviates the burden of obtaining results of the CPU 130 because the CPU 130 does not have to fetch the results one by one from the MCU 120.

The CPU 130 executes the operating system (OS) and the applications of the mobile device 100. The further preset processing is just one of many tasks performed by the CPU 130. The MCU 120 is exclusively dedicated to performing the initial preset processing according to the samples and providing the one or more results or the signal to the CPU 130. The CPU 130 has much more processing power than the MCU 120 does and the CPU 130 consumes much more electric power than the MCU 120 does. The MCU 120 takes over the burden of collecting the samples from the sensor 110 and performing the initial preset processing from the CPU 130 so that the CPU 130 can sleep as long as possible in order to save power and extend the battery life of the mobile device 100. The batch fetching of results from the MCU 120 helps to reduce the waking frequency of the CPU 130, which saves more power. The MCU 120 constantly polls the sensor 110 and fetches the samples from the sensor 110. The MCU 120 never sleeps.

The CPU 130 may sleep until the CPU 130 wakes up to fetch the result from the MCU 120 or until the CPU 130 is woke up by the signal from the MCU 120. The MCU 120 may wake up the CPU 130 and notifies the CPU 130 to fetch the result from the MCU 120. Alternatively, the CPU 130 may wake up when the user of the mobile device 100 launches an application or when a timer expires. In other words, the CPU 130 may wake up without notification from the MCU 120, and then the CPU 130 may fetch the one or more results from the MCU 120.

Figure 2:
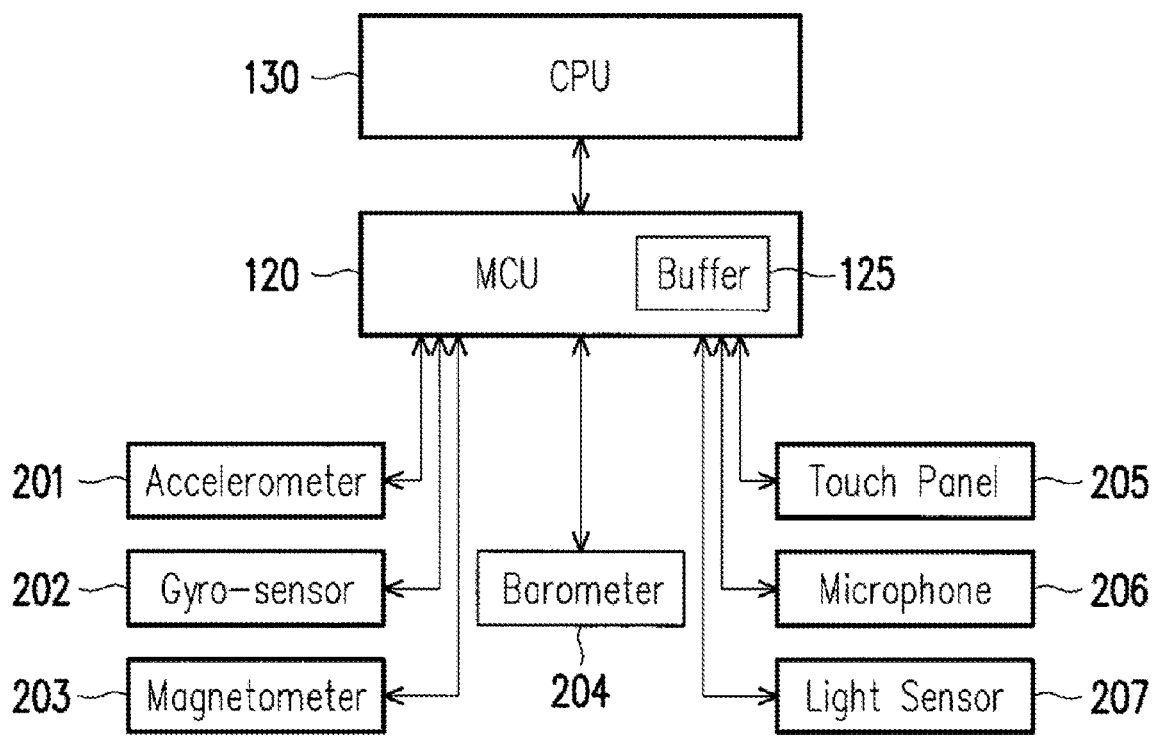
FIG. 2 is a schematic diagram showing a mobile device according to another embodiment of the present application.

FIG. 2 is a schematic diagram showing a mobile device 200 according to another embodiment of the present application. The mobile device 200 includes the CPU 130, the MCU 120, and seven sensors 201-207, namely, the accelerometer 201, the gyro-sensor 202, the magnetometer 203, the barometer 204, the touch panel 205, the microphone 206, and the light sensor 207. The accelerometer 201 generates samples of accelerations associated with movements and rotations of the mobile device 200. The gyro-sensor 202 generates samples of angular velocities associated with movements and rotations of the mobile device 200. The magnetometer 203 generates samples of magnetism associated with movements and rotations of the mobile device 200. The barometer 204 generates samples of atmospheric pressures associated with movements and rotations of the mobile device 200. The touch panel 205 generates samples of locations touched by the user of the mobile device 200. The microphone 206 generates samples of sound around the mobile device 200. The light sensor 207 generates samples of the ambient brightness around the mobile device 200. Each of the sensors 201-207 may include a buffer as the sensor 110 does.

The MCU 120 is coupled to all of the sensors 201-207 and operates as a sensor hub. Each subset of the mobile device 200 including the CPU 130, the MCU 120, and one of the sensors 201-207 may operate in the same ways as the mobile device 100 shown in FIG. 1 does. In addition, the MCU 120 and the CPU 130 may perform preset processing based on samples generated by multiple sensors altogether. In another embodiment of the present application, the mobile device 200 may include less than seven sensors or more than seven sensors.

In an embodiment of the present application, the mobile device 200 may provide the function of a pedometer. The MCU 120 fetches the samples from the accelerometer 201 and performs the initial preset processing by calculating how many steps the user of the mobile device 200 has walked according to the samples. The MCU 120 may store the result of the initial preset processing, namely, the number of steps, in the buffer 125.

The MCU 120 may wake up the CPU 130 to fetch the result every N steps, wherein N is a preset positive integer. Alternatively, the CPU may wake up periodically to fetch the result from the MCU 120. Alternatively, the CPU may wake up whenever the user launches an application to see the number of steps. The infrequent awakening of the CPU 130 saves energy. Sometimes the user walks for hours and does not want to see the number of steps until the user arrives at home. In this case, the CPU 130 may sleep for hours and saves a lot of energy.

In addition to counting the number of steps, the initial preset processing performed by the MCU 120 may include calculating the direction and the distance of each step of the user according to the samples generated by the accelerometer 201, the gyro-sensor 202, and the magnetometer 203. The MCU 120 may store the results, namely, the directions and distances of the steps, in the buffer 125. The MCU 120 may wake up the CPU 130 and notifies the CPU 130 to fetch the results when the size of the results reaches a preset percentage of the capacity of the buffer 125.

When the CPU 130 wakes up, the further preset processing performed by the CPU 130 may include displaying the number of steps, displaying a chart showing the number of steps in each hour, or plotting the trace of the user according to the directions and the distances of the steps, etc.

In another embodiment of the present application, the mobile device 200 may provide functions of positioning and navigation based on the Global Positioning System (GPS). The user may turn off the GPS function to save power. The CPU 130 sleeps when the GPS function is turned off. During the period when the GPS function is turned off, the MCU 120 may fetch the samples generated by the accelerometer 201, the gyro-sensor 202, and the magnetometer 203 to calculate the moving trace of the mobile device 200. The MCU 120 may store the moving trace in the buffer 125 as the result of the initial preset processing. When the user turns on the GPS function, the CPU 130 may fetch the moving trace from the MCU 120 and use the moving trace and the last GPS position of the mobile device 200 to calculate a reference position so that the CPU 130 can find the current GPS position of the mobile device 200 faster.

In another embodiment of the present application, the MCU 120 may calculate the moving trace of the mobile device 200 according to the samples generated by the barometer 204 in addition to the samples generated by the accelerometer 201, the gyro-sensor 202, and the magnetometer 203, so that the moving trace can include more accurate estimation of the change of altitude of the mobile device 200.

In another embodiment of the present application, the mobile device 200 may switch between an unlocked state and a locked state. The mobile device 200 receives input from the touch panel 205 normally in the unlocked state, while the mobile device 200 does not receive input from the touch panel 205 in the locked state. The CPU 130 sleeps in the locked state. For example, the mobile device 200 may enter the locked state from the unlocked state when the mobile device 200 has been idle for a preset period of time, and the mobile device 200 may return to the unlocked state when the user performs a preset operation on the mobile device 200.

The preset operation for unlocking the mobile device 200 may be drawing a preset trace on the touch panel 205. In this case, the MCU 200 may fetch the samples generated by the touch panel 205 and analyze the samples to determine whether the user draws the preset trace or not. When the user finishes the preset trace on the touch panel 205, the MCU 120 may send a signal, such as an interrupt, to wake up the CPU 130. The CPU 130 switches the mobile device 200 from the locked state to the unlocked state in response to the signal.

Alternatively, the preset operation for unlocking the mobile device 200 may be speaking a preset password to the microphone 206. In this case, the MCU 200 may fetch the samples generated by the microphone 206 and perform speech recognition on the samples to determine whether the user speaks the preset password or not. When the user speaks the preset password to the microphone 206, the MCU 120 may send a signal to wake up the CPU 130. The CPU 130 switches the mobile device 200 from the locked state to the unlocked state in response to the signal.

Alternatively, the preset operation for unlocking the mobile device 200 may be holding the mobile device 200 and moving the mobile device 200 along a preset trace. In this case, the MCU 200 may fetch the samples generated by the accelerometer 201, the gyro-sensor 202, and the magnetometer 203 and analyze the samples to determine whether the mobile device 200 has moved along the preset trace or not. When the mobile device 200 has moved along the preset trace, the MCU 120 may send a signal to wake up the CPU 130. The CPU 130 switches the mobile device 200 from the locked state to the unlocked state in response to the signal.

In another embodiment of the present application, the mobile device 200 may include a display. The MCU 120 may fetch the samples generated by the light sensor 207 and analyze the samples to calculate the average ambient brightness of the mobile device 200 over a recent period of time with a predetermined length. The MCU 120 may store the average ambient brightness in the buffer 125. The CPU 130 may fetch the average ambient brightness periodically and adjusts the display brightness of the display according to the average ambient brightness.

Figure 3:
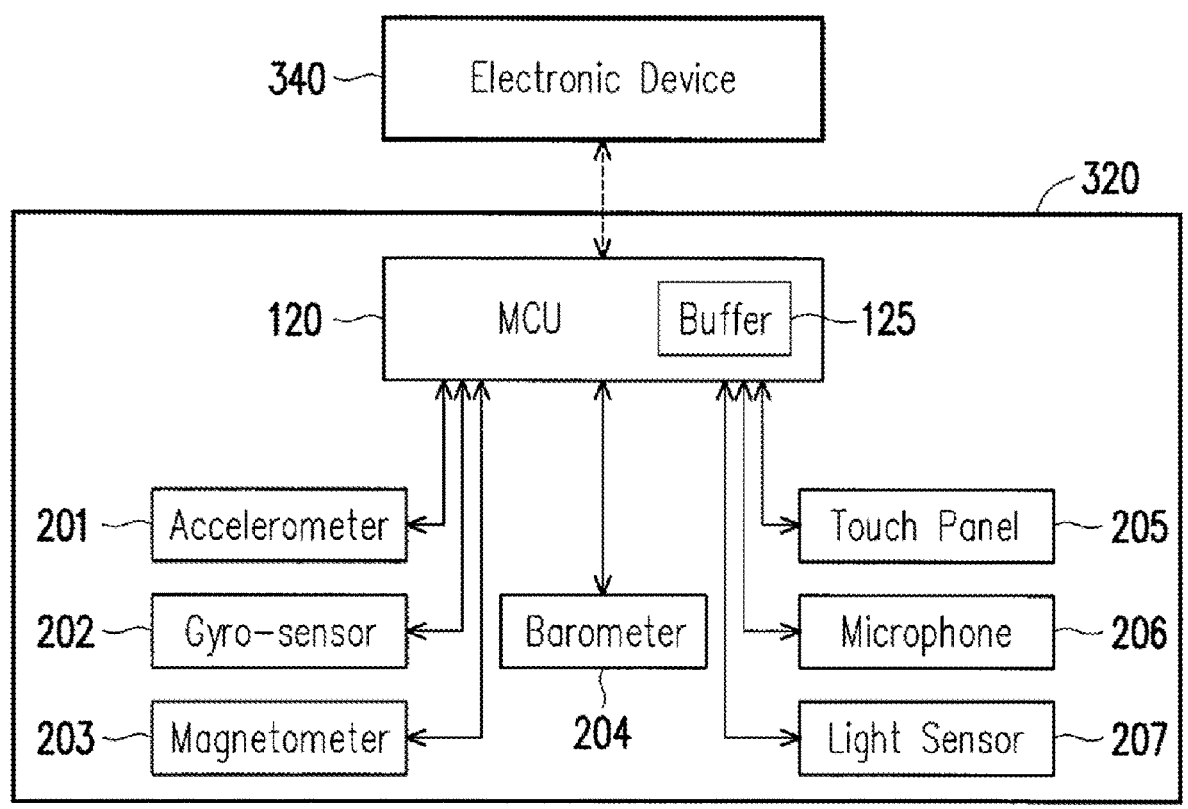
FIG. 3 is a schematic diagram showing a mobile device according to another embodiment of the present application.

FIG. 3 is a schematic diagram showing a mobile device 320 according to another embodiment of the present application. The mobile device 320 includes the MCU 120 and the sensors 201-207. Similar to the previous embodiments, the MCU 120 may fetch the samples generated by one or more of the sensors 201-207 and performs the initial preset processing according to the samples. The MCU 120 may store the samples and/or the result(s) of the initial preset processing in the buffer 125. The MCU 120 in this embodiment is configured to connect to the electronic device 340 through a wireless connection or a wired connection. The MCU 120 is further configured to provide the result(s) of the initial preset processing to the electronic device 340 through the wireless connection or the wired connection. The electronic device 340 may perform further preset processing according to the one or more results. In some aspects, the electronic device 340 is analogous to the CPU 130 in the previous embodiments.

For example, the mobile device 320 may be a wearable electronic pedometer. The MCU 120 counts the number of steps walked by the user according to the samples generated by the accelerometer 201. The MCU 120 may store the number of steps in the buffer 125. In addition, the MCU 120 may provide the number of steps to the electronic device 340 for further viewing or processing.

For another example, the mobile device 320 may be a small device attachable to a palm or an arm of a user or a golf stick wielded by the user. When the user plays golf, the MCU 120 may fetch the samples generated by the accelerometer 201, the gyro-sensor 202, and the magnetometer 203 to calculate the number of swings of the golf stick made by the user. The MCU 120 may store the number of swings in the buffer 125. In addition, the MCU 120 may provide the number of swings to the electronic device 340 for further viewing or processing.

Alternatively, the MCU may analyze the samples generated by the accelerometer 201, the gyro-sensor 202, and the magnetometer 203 to obtain the time and force of each swing of the golf stick made by the user. The MCU 120 may store the results of the analysis in the buffer 125. In addition, the MCU 120 may provide the results of the analysis to the electronic device 340 for further viewing or processing.

In summary, the MCU provided by the present application is a sensor hub with a buffer. The MCU can take over the burden of collecting and analyzing the samples generated by the sensors from the CPU of a mobile device. As a result, the MCU alleviates the burden of the CPU and the CPU may sleep as long as possible to save energy and extend the battery life of the mobile device.

Figure 4:
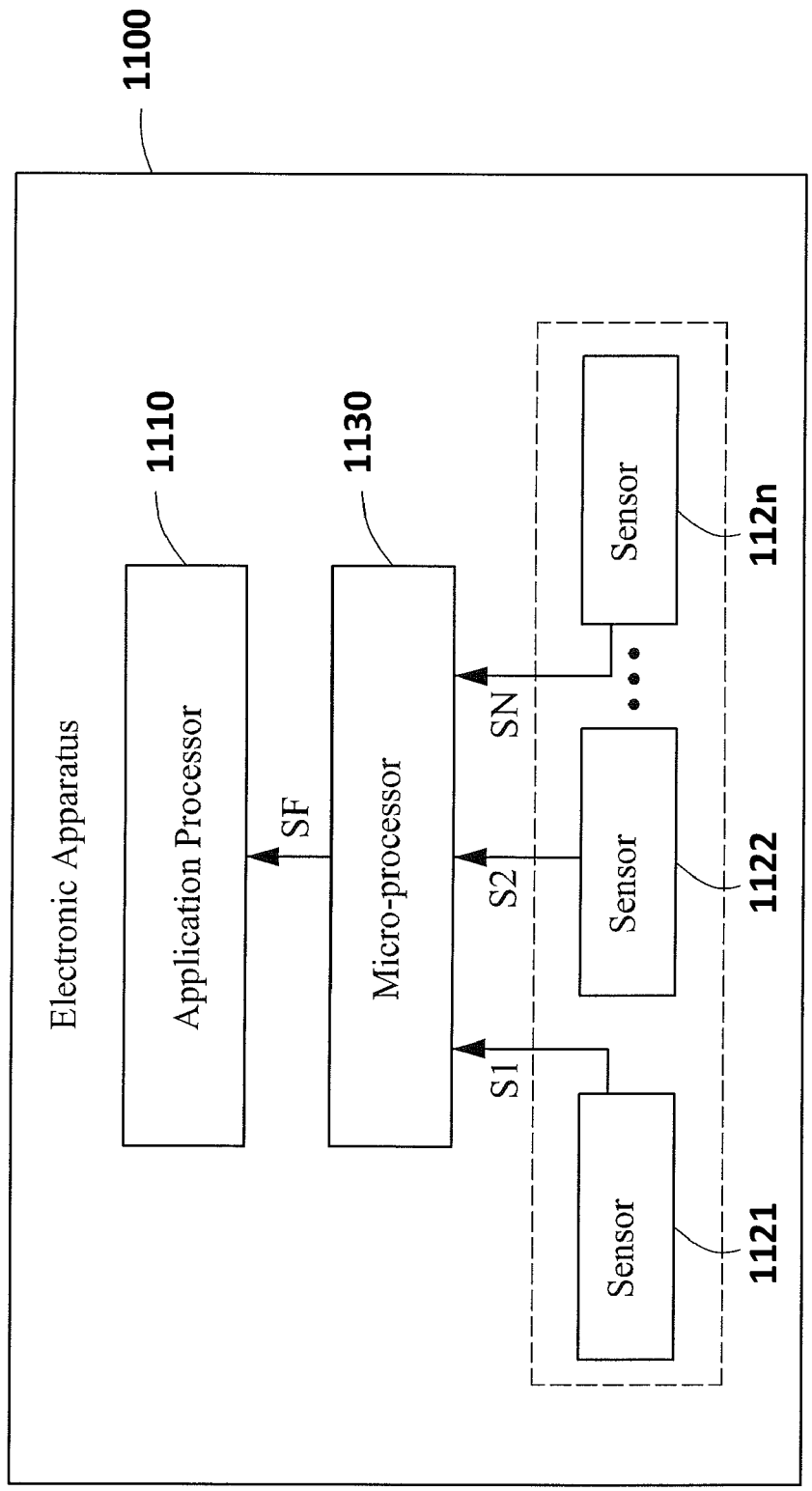
FIG. 4 is a diagram showing an electronic apparatus according to another embodiment of the present application.

Please refer to FIG. 4. FIG. 4 is a diagram showing an electronic apparatus 1100 according to another embodiment of the present application. The electronic apparatus 1100 can be a mobile phone, a tablet PC, a PDA, etc. The electronic apparatus 1100 may include, but is not limited to, an application processor 1110, a plurality of sensors 1121-112n, and a micro-processor 1130. The plurality of sensors 1121-112n is configured to generate at least one sensing signal(s) S1-Sn. The application processor 1110 is configured to execute an application procedure according to a sensing-merged signal SF. The micro-processor 1130 is coupled between the plurality of sensors 1121-112n and the application processor 1110, and is configured to generate the sensing-merged signal SF according to the at least one sensing signal(s) S1-Sn.

The plurality of sensors 1121-112n mentioned above can be implemented by an accelerometer, a rotation sensor, a magnetometer, and/or an altimeter, however, this should not be a limitation of the present application. In addition, please note that, a computing ability of the application processor 1110 is greater than a computing ability of the micro-processor 1130. For example, the application processor 1110 may be a multi-core baseband processor of a mobile phone, and the micro-processor 1130 may be a single chip microcontroller. Those skilled in the art should understand the difference(s) between the application processor 1110 and the micro-processor 1130 easily, and thus further description is omitted here for brevity.

Please be noted that, when the application processor 1110 of the electronic apparatus 100 of the present application gets into a sleep mode, the micro-processor 1130 is still working so as to maintain fundamental functions of the electronic apparatus 1100. As a result, even if the handheld electronic apparatus 1100 gets into the sleep mode, the application processor 1110 can be waked up through detecting motions of the electronic apparatus 1100. For example, when the application processor 1110 gets into the sleep mode, the application processor 1110 turns off a display module (not shown) of the electronic apparatus 1100, and locks a touch panel (not shown) of the electronic apparatus 1100. The locking mechanism of the electronic apparatus 1100 of the present application is listed below. Step (1): a user swings the electronic apparatus 1100, and motions and/or rotations of the electronic apparatus 100 are detected by the plurality of sensors 1121-112n so as to generate sensing signals S1-Sn; step (2) the sensing-merged signal SF, which can be used for waking up the application processor 1110, is then generated by the micro-processor 1130 according to the sensing signals S1-Sn; and step (3) the application processor 1110 receives the sensing-merged signal SF and then executes an application procedure according to the sensing-merged signal SF. For example, the application processor 1110 may compare the sensing-merged signal SF to see whether it corresponds to a specific gesture or not; and if the sensing-merged signal SF corresponds to the specific gesture, the abovementioned display module will be enabled and enter an unlocked status automatically. Therefore, the electronic apparatus 1100 no need to have a physical button as the prior art, and the user no need to press the physical button so as to unlock the electronic apparatus 1100. In addition, when the display module of the electronic apparatus 1100 is turned off, the application processor 1110 can continue to play back music. The electronic apparatus 1100 of the present application can generate motion data through detecting motions and/or rotations according to the plurality of sensors 1121-112n when the user swings the electronic apparatus 1100; and the micro-processor 1130 can process the motion data and then the application processor 1110 can control the played music. For example, the user can beat the left side of the electronic apparatus 1100 so as to select to play back a previous song, or beat the right side of the electronic apparatus 1100 so as to select to play back a next song.

On the other hand, another advantage of the present application is that: the function of the step counter, or pedometer, can still work after the application processor 1110 gets into the sleep mode. For example, when the application processor 1110 gets into the sleep mode and the electronic apparatus 1100 uses the function of the step counter, the sensor 1121 (such as an accelerometer) can generate the at least one sensing signal S1. The microprocessor 1130 can generate a counting information according to the at least one sensing signal S1 generated by the accelerometer. Please note that, in another embodiment of the present application, the micro-processor 1130 can set a default counting information, such as 1000 counts. That is to say, when the counting information is up to 1000 counts, the micro-processor 1130 can wake up the application processor 1110 by using the sensing-merged signal SF.

Figure 5:
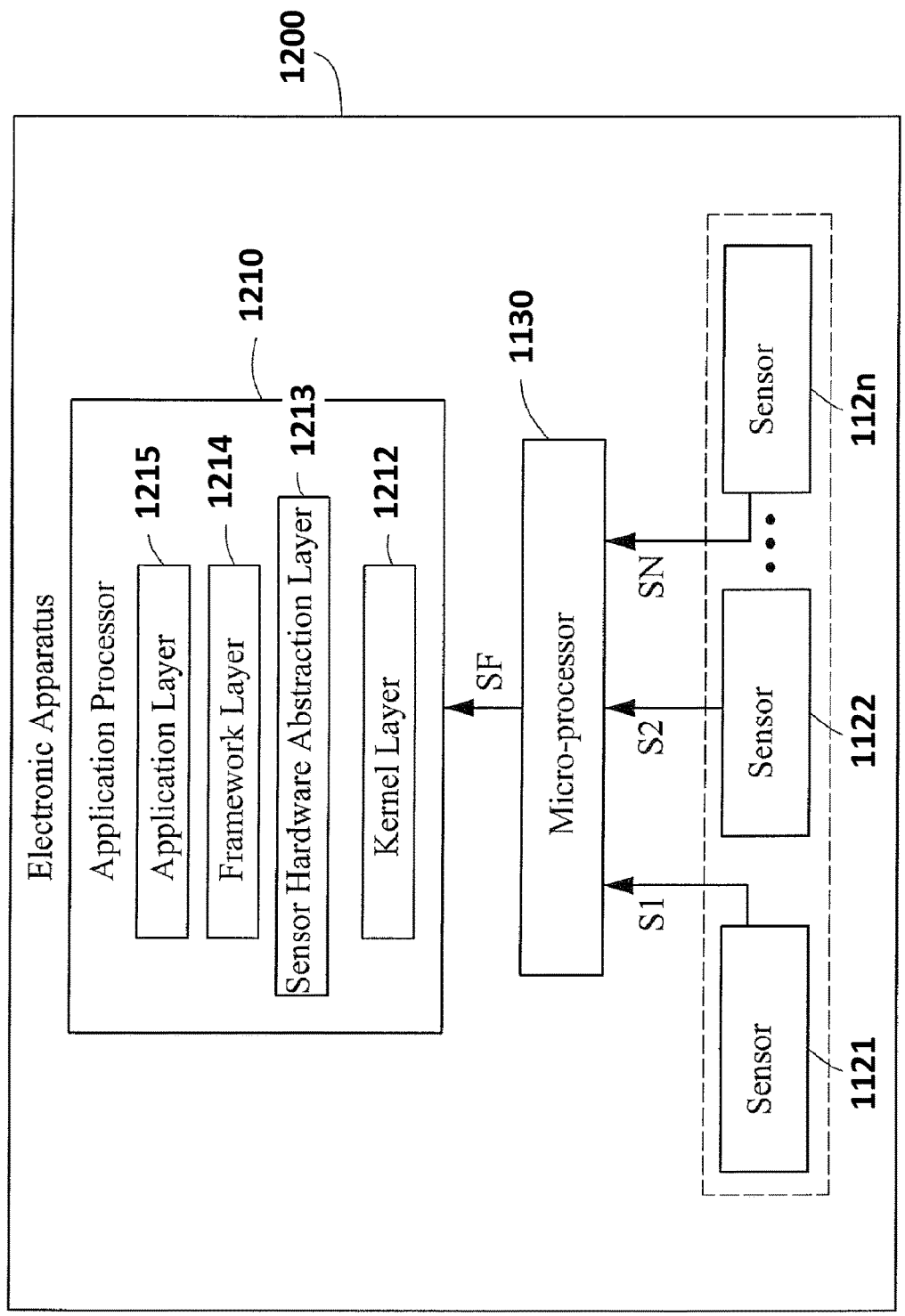
FIG. 5 is a diagram showing an electronic apparatus according to another embodiment of the present application.

Please refer to FIG. 5. FIG. 5 is a diagram showing an electronic apparatus 1200 according to a second embodiment of the present application. The electronic apparatus 1200 may include an application processor 1210, a micro-processor 1130, and a plurality of sensors 1121-112n. The plurality of sensors 1121-112n mentioned above can be implemented by an accelerometer, a rotation sensor, a magnetometer, and/or an altimeter. The application processor 1210 may include a Kernel layer 1212, a sensor hardware abstraction layer (sensor HAL) 1213, a framework layer 1214, and an application layer 1215, wherein the application layer 1215 can be Android System's application layer. The micro-processor 1130 is disposed between the application processor 1210 and the plurality of sensors 1121-112n. The plurality of sensors 1121-112n will generate corresponding sensing signals S1-SN after sensing, and will transmit the sensing signals S1-SN to the micro-processor 1130. The micro-processor 1130 merges the sensing signals S1-SN generated by the plurality of sensors 1121-112n and then transmits a sensing-merged signal SF to the application processor 1210. The application processor 1210 executes a corresponding application procedure according to the sensing-merged signal SF. Please be noted that, the communication between the application processor 1210 and the micro-processor 1130 is implemented by an internal integrated circuited port; and the communication between the micro-processor 1130 and the plurality of sensors is implemented by an internal integrated circuited port; however, this should not be a limitation of the present application.

The electronic apparatus 1100/1200 is characterized in that: the micro-processor 1130 can be selectively enabled or disabled to save power. For example, the plurality of sensors 1121-1212N may include an accelerometer, and the sensing signal generated by the accelerometer can be used for controlling enabling and disabling of the micro-processor 1130. In more details, when the accelerometer generates an acceleration-related sensing signal, it represents that the electronic apparatus 1100/1200 is moving (for example, the sensing signal can be at a high level at this time) so as to enable the micro-processor 1130. After the micro-processor 1130 is enabled, it can merge the sensing signals S1-SN generated by the plurality of sensors 1121-112n to generate a sensing-merged signal SF according to an algorithm. The sensing-merged signal SF is then transmitted from the micro-processor 1130 to the application processor 1110/1210 in order to let the application processor 1110/1210 execute the corresponding application procedure.

Figure 6:
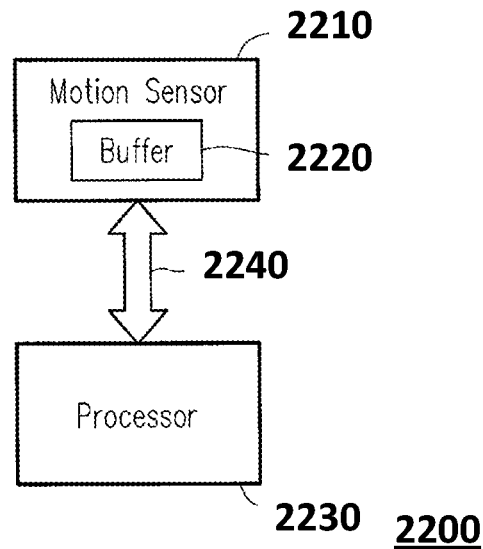
FIG. 6 is a schematic diagram showing an electronic device according to another embodiment of the present application.

The advantage of the configuration of the present application is that: determining whether to enable the micro-processor 1130 to save power by using characteristics of the plurality of sensors. For example, in the abovementioned embodiment, it can determine whether to enable the micro-processor 1130 by adopting the accelerometer sensor. In other words, the electronic apparatus 1100/1200 with such configuration can determine whether to enable the micro-processor 1130 to execute the corresponding application procedure to save power based on the motion detection itself. Please be noted that, in one embodiment of the electronic apparatus 1100/1200 of the present application, the micro-processor 1130 and at least one of the plurality of sensors 1121-112n are not packed in a single chip, however, this should not be a limitation of the present application. Some of the plurality of sensors 1121-112n can be packed in a single chip. Furthermore, the micro-processor 1130 is independent with the application processor 1110/1210, and they are not packed in a single chip. Please note that, driver programs of the plurality of sensors 1121-112n can be preloaded into the micro-processor 1130. Therefore, if a developer adopts the micro-processor 1130 of the present application, the sensing signals S1-SN of the plurality of sensors 1121-112$n$ can be successfully processed. The advantage of the configuration of the present application is that: the elasticity for choosing sensor chip vendors can be improved. FIG. 6 is a schematic diagram showing an electronic device 2200 according to an embodiment of the present application. The electronic device 2200 may be a smart phone, a personal digital assistant (PDA), a tablet computer, a remote control, or any other electronic device that can be moved and/or rotated. The electronic device 2200 includes a motion sensor 2210, a processor 2230, and a bus 2240. The motion sensor 2210 includes a buffer 2220. The processor 2230 is coupled to the motion sensor 2210 through the bus 2240.

Please note that the motion sensor may be a gyro-sensor, an accelerometer, a 6-axis motion sensor or a 9-axis motion sensor. In an embodiment of the present application, the motion sensor 2210 may be a gyro-sensor that detects and samples the angular velocity of the electronic device 2200. In another embodiment of the present application, the motion sensor 2210 may be an accelerometer that detects and samples the acceleration of the electronic device 2200. In another embodiment of the present application, the motion sensor 2210 may be a 6-axis motion sensor that detects and samples the acceleration or the angular velocity of the electronic device 2200. In another embodiment of the present application, the motion sensor 2210 may be a 9-axis motion sensor that detects and samples the acceleration, the angular velocity or the magnetism of the electronic device 2200. Those skilled in the art can readily understand 6-axis motion sensor comprises a 3-axis gyroscope and a 3-axis accelerometer, and further description is omitted here for brevity. Similarly, the 9-axis motion sensor comprises a 3-axis gyroscope, a 3-axis accelerometer and a 3-axis compass, and further description is omitted here for brevity. The buffer 2220 may be a first-in-first-out (FIFO) register that can store a plurality of samples produced by the motion sensor 2210. The processor 2230 may be the CPU, a microprocessor, or an embedded controller of the electronic device 2200.

Figure 7:
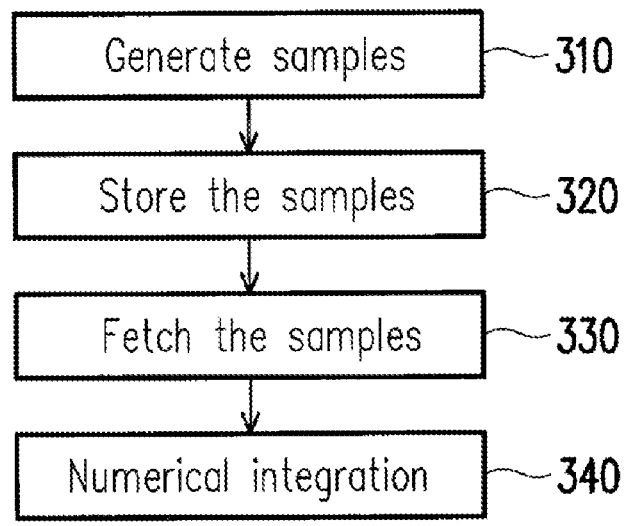
FIG. 7 is a flow chart showing a method of motion processing according to another embodiment of the present application.

FIG. 7 is a flow chart showing a method of motion processing according to an embodiment of the present application. The method shown in FIG. 7 may be executed by the electronic device 2200. In step 310, the motion sensor 2210 performs a sampling at a predetermined sampling rate. The processor 2230 may set the sampling rate for the motion sensor 2210 by accessing a configuration register of the motion sensor 2210 before executing the method shown in FIG. 7. In each sampling, the motion sensor 2210 generates a sample by sampling an angular velocity or an acceleration of the electronic device 2200. In step 320, the motion sensor 2210 stores each sample generated in step 310 in the buffer 2220.

In step 330, the processor 2230 polls the motion sensor 2210 periodically at a predetermined polling rate. The sampling rate for the motion sensor 2210 may be higher than or equal to the polling rate for the processor 2230. Therefore, each time when the processor 2230 polls the motion sensor 2210, there may be already a plurality of samples stored in the buffer 2220 so that the processor 2230 may fetch more than one sample from the buffer 2220. The processor 2230 may fetch a part or all of the samples stored in the buffer 2220 in each aforementioned polling. The processor 2230 performs the polling and the fetching through the bus 2240.

In step 340, the processor 2230 performs a numerical integration based on the samples fetched in step 330. When the motion sensor 2210 is a gyro-sensor, the samples may be angular velocities of the electronic device 2200 and the result of the numerical integration may be an angle of the rotation or the orientation of the electronic device 2200. When the motion sensor 2210 is an accelerometer, the samples may be accelerations of the electronic device 2200 and the result of the numerical integration may be a velocity or a distance of the translation of the electronic device 2200. The processor 2230 may use a part or all of the samples fetched in step 330 to perform the numerical integration. The more samples used, the smaller the accumulated error of the numerical integration.

Figure 8:
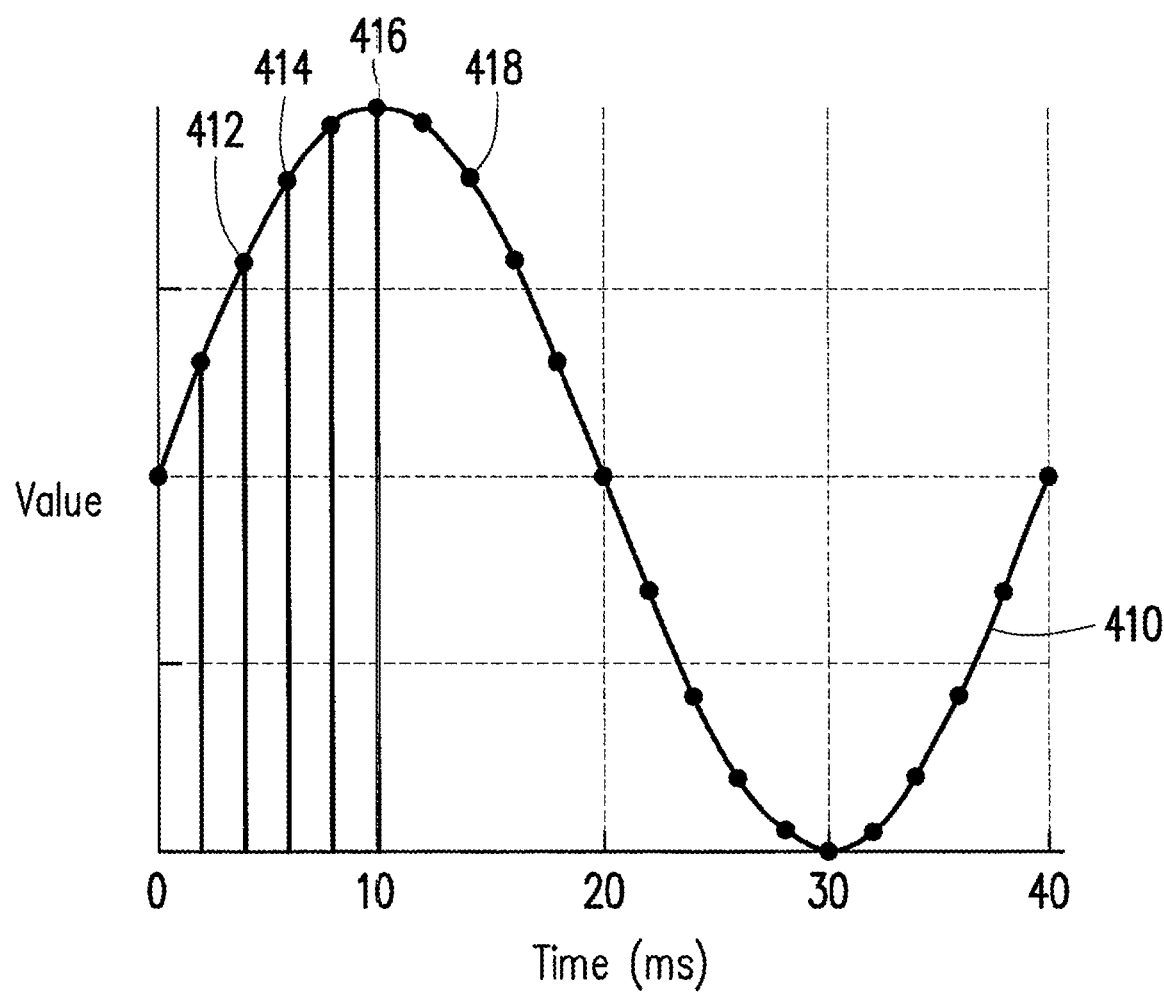
FIG. 8 is a schematic diagram showing the sampling of a motion processing according to another embodiment of the present application.

FIG. 8 is a schematic diagram showing the sampling of a motion processing of the electronic device 2200 according to an embodiment of the present application. The curve 410 represents the angular velocity or the acceleration sampled by the motion sensor 2210. The samples are represented by round dots on the curve 410, such as the samples 412, 414, 416 and 418.

In this embodiment, the sampling rate of the motion sensor 2210 is 500 Hz and the polling rate of the processor 2230 is 100 Hz. In other words, the motion sensor 2210 produces a sample every two milliseconds, while the processor 2230 polls the motion sensor 2210 every ten milliseconds. At each polling, there are already five samples stored in the buffer 2220 waiting for the processor 2230. The processor 2230 may fetch a part or all of the five samples stored in the buffer 2220.

In this way, the processor 2230 may set the sampling rate of the motion sensor 2210 to be much higher than the polling rate of the processor 2230 such that there are a lot of samples available to the processor 2230 at each polling. The low polling rate can free the processor 2230 from frequently accessing the bus 2240 for the polling and the fetching so that the processor 2230 has more time to process the other tasks of the electronic device 2200. In addition, the high sampling rate of the motion sensor 2210 means more samples and smaller accumulated error of the numerical integration.

In this embodiment, the processor 2230 uses the sampling period corresponding to the sampling rate of the motion sensor 2210 as the height (or width) of the trapezoids defined by the samples to perform the numerical integration in step 340. In other words, the processor 2230 performs the numerical integration according to the clock of the motion sensor 2210 instead of the clock of the processor 2230 itself, which eliminates the accumulated error caused by two asynchronous clocks. The motion sensor 2210 is dedicated to generating the samples according to its own clock. Unlike the processor 2230, the motion sensor 2210 has no other distracting tasks. Therefore, the sampling time of the motion sensor 2210 is very accurate, which helps to reduce the accumulated error of the numerical integration.

In summary, the present application can effectively reduce the accumulated error of the numerical integration in motion processing by more accurate sampling time and higher sampling rate. Moreover, the present application does not require a dedicated pin of the processor because the processor does not need interrupt for fetching the samples.

It should be noted that, in some embodiments, fetch behavior of the processing signal from sensor hub (MCU) to the application processor (AP or CPU) may be altered depending on the application. By way of example, for gaming applications (which may require a relatively fast update frequency), the system may defer to using a bypass mode, in which batch fetching may not be performed. A potential disadvantage in using such a bypass mode may involve the AP needing to wake up frequently (e.g., waking up every time it retrieves signals from the MCU). In contrast, for PDR or health monitoring functions (which may not require updating as fast), the AP would fetch processing signals in batch mode to reduce power consumption.

Meanwhile, in some embodiments, a gyroscope may need to fetch samples in batch mode such as under a precise clock of the gyroscope or an outside timer. This is because the samples generated by the gyroscope are in the form of relative vectors. Such relative vectors typically are computed under integral calculation to obtain a relative rotation angle. As a result, the sampled data is typically reserved in a sequence format (similar to streaming) in the buffer in order to increase accuracy. Thus, accuracy is a primary reason for using the batch mode in the sensor side, though power consumption may also be a consideration.

Unlike that of the gyroscope, samples generated by the accelerometer are absolute directional vectors. With respect to system usage, the system may not need to retrieve accelerometer samples as frequently as gyroscope samples. For instance, the MCU may retrieve accelerometer samples in 20-40 ms without much deviation, while the MCU may retrieve gyroscope samples in 5 ms. Therefore, the accelerator samples may only need to be uploaded to the MCU when the MCU determines that a sample is required.

Figure 9:
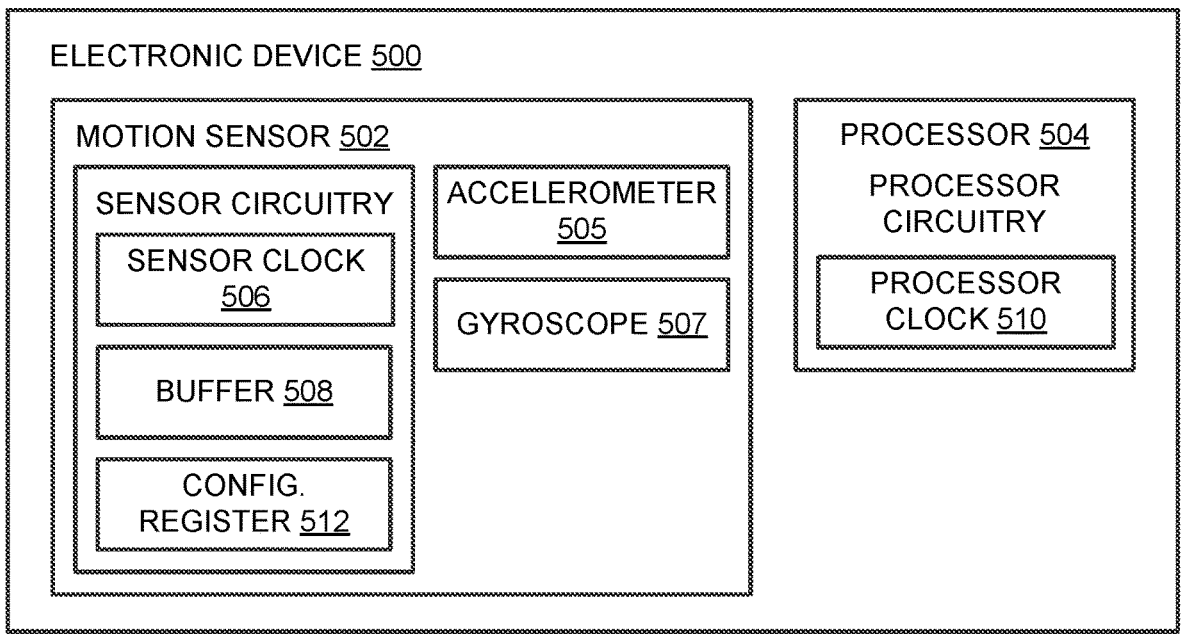
FIG. 9 is a schematic diagram showing an electronic device according to another embodiment of the present application.

FIG. 9 is a schematic diagram showing an electronic device according to another embodiment of the present application. As shown in FIG. 9, electronic device 500 incorporates a motion sensor 502 and a processor 504. Motion sensor 502 includes sensor circuitry such as a sensor clock 506 and a buffer 508. Motion sensor 502 is configured to provide one or more samples at a sampling rate according to sensor clock 506. In some embodiments, each of the samples includes at least one of an accelerometer sample (provided by an optional accelerometer 505) or a gyroscope sample (provided by an optional gyroscope 507) associated with the electronic device. Motion sensor 502 also is configured to store each of the samples in buffer 508.

Processor 504 incorporates processor circuitry such as a processor clock 510. Processor 504 is coupled to motion sensor 502 and is configured to perform polling at a polling rate. In particular, for each polling, processor 504 fetches the samples from buffer 508 in batches. In some embodiments, such as shown in FIG. 9, processor 504 lacks a dedicated interrupt pin configured to facilitate fetching of the samples.

Based on the samples fetched from the buffer, processor 504 performs a numerical integration according to the sensor clock. By way of example, the numerical integration may involve sensor fusion computation such as orientation computation, sensor bias computation, or context awareness computation. The computation may selectively utilize acceleration samples to obtain a reference status if the acceleration data have been steady. The gyroscope samples can be utilized to continuously estimate moving status based on the status reference previously determined. The estimated moving status can be computed and accumulated over a sequence of time count. By adding the accumulated moving status into the reference status, a fusion status representing the status of a moving object can be derived.

In some embodiments, processor 504 is configured to use less than all of the samples fetched from the buffer to perform the numerical integration, whereas, in others, processor 504 is configured to use all of the samples fetched.

Also depicted in FIG. 9 is configuration register 512 of motion sensor 502. In some embodiments, processor 504 is configured to set the sampling rate of motion sensor 502 by accessing configuration register 512. For example, the motion sensor 502 can be a sensor chip which incorporates the accelerometer 505, the gyroscope 507, and a FIFO buffer. When performing sensor data sampling, the motion sensor 502 generates motion samples at a highest data rate according to the sensor clock embedded in the sensor chip. A FIFO engine of the FIFO buffer selects less than all of the samples generated at the highest rate and produces sensor samples at a lower sampling rate. The aforementioned lower sampling rate can also be named as a data output rate (ODR) requested by the processor 504. The information for the requested ODR is registered in a configuration register of the FIFO buffer. The FIFO engine temporally stores sensor samples produced in the FIFO buffer according the configuration register. So configured, processor 504 may use a sampling period corresponding to the sampling rate to perform the numerical integration. In some embodiments, motion sensor 502 is configured to generate the samples at a rate higher than the sampling rate. For instance, in some embodiments, the accelerometer 505 and the gyroscope 507 always generate samples at a data rate of 6400 Hz and 1600 Hz, respectively, according to the sensor clock embedded in the sensor chip, whereas the sampling rate may be 100 Hz for both.

In operation, motion sensor 502 of electronic device 500 provides one or more samples, including at least one of an accelerometer sample or a gyroscope sample, at a sampling rate according to sensor clock 506. Each of the one or more samples is then stored in buffer 508. Processor 504 fetches the samples in batches from buffer 508 at a polling rate. Then, processor 504 performs a numerical integration according to sensor clock 506 based on the samples fetched from buffer 508.

Figure 10:
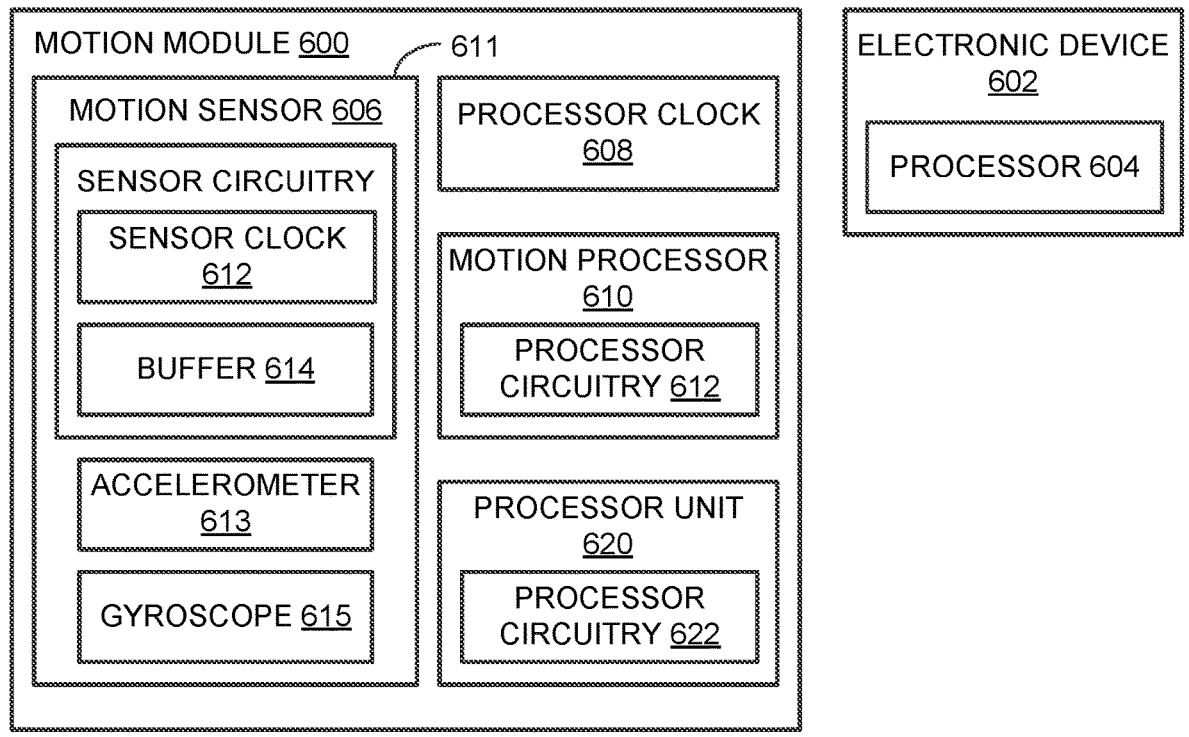
FIG. 10 is a schematic diagram showing a motion module according to another embodiment of the present application.

FIG. 10 is a schematic diagram showing a motion module according to another embodiment of the present application. As shown in FIG. 10, motion module 600 is configured for use with an electronic device 602 (e.g., a portable electronic device, such as a smartphone, smartwatch, or a stereo headset) that incorporates a processor 604. For example, the stereo headset can reproduce directional audio sound based on the position (or orientation) and an audio source. The stereo headset incorporates a left audio channel and a right audio channel. Audio sound outputted through the left and right audio channel can be reproduced by an application processor according to the position sensed by a motion module. Based on the sensed position and a sound source, the application processor reproduces the directional audio sound by adjusting a weight of sound intensity and/or asserting different frequency modulation on the left and right audio channel, respectively.

In particular, motion module 600 includes a motion sensor 606, a processor clock 608, and a motion processor 610. Motion sensor 606 incorporates sensor circuitry (e.g., a sensor clock 612 and a sensor buffer 614) and is configured to produce motion samples. In some embodiments, sensor buffer 614 is located inside a housing 611 of motion sensor 606, such as when the motion module is implemented in a wearable device or implemented as a system in package (SIP). In some embodiments, motion sensor 606 includes one or more accelerometers (e.g., accelerometer 613) and one or more gyroscopes (e.g., gyroscope 615) that are configured to provide accelerometer samples and gyroscope samples, respectively, at the sampling rate according to sensor clock 612.

Motion sensor 606 stores the motion samples in sensor buffer 614 at a sampling rate according to sensor clock 612. It should be noted that processor clock 608 is a different clock than sensor clock 612. Additionally, motion sensor 606 is configured to provide a buffer status responsive to a sample count of the motion samples stored in sensor buffer 614 corresponding to a watermark value. In this regard, the watermark is assigned respectively for the accelerometer 613 and gyroscope 615 by the motion processor 610. The sensor buffer 614 is a FIFO buffer that counts number or length of motion samples readily stored in the sensor buffer. If the count reaches the watermark value, the sensor buffer can issue a data ready status to inform the motion processor 610. The sensor chip can also produce a sensor time frame according to the sensor clock. The sensor time frame contains timestamp content corresponding to the time at which the last sensor samples were produced according to the sensor clock. When the sensor samples are fetched in batch, the motion processor 610 can compute the time interval between each batch according to the sensor time frame.

Motion processor 610 incorporates processor circuitry 612 and is coupled to motion sensor 606. Motion processor 610 is configured to perform fetching of all of the motion samples stored in sensor buffer 614 in response to the buffer status (which may indicate various statuses, such as the data ready status and completion of fetching), and to suspend communicating with motion sensor 606 in response to completion of the fetching. Besides, the motion sensor 606 can be operated in a normal mode when it performs sensor data sampling and supports sensor data readout through the FIFO buffer 614, a suspend mode when it suspends sensor data sampling and sensor data read out through the FIFO buffer 614, and a low power mode when it operates duty-cycling between the suspend mode and the normal operation mode. In order to reduce power consumption, motion sensor 606 always operates in the low power mode and provides accelerometer samples and gyroscope samples at low ODR, such as 100 Hz. The motion sensor 606 can switch to the suspend mode in response to the completion of fetching. The power consumption can be further reduced while accumulated error of the numerical integration is still limited in an acceptable range. The motion processor 610 is operated in a low power mode by intermittently switching between a suspend mode and a full operation mode. In the suspend mode, the motion processor 610 suspends executing of program code, such as the performing of numerical integration and sensor sample fetching from the motion sensor 606. Moreover, the motion sensor 606 may not, in some embodiments, include a magnetometer due to anticipated magnetic interference from a speaker of the stereo headset.

In some embodiments, motion processor 610 is configured to fetch the motion samples (e.g., the accelerometer samples and the gyroscope samples) stored in the sensor buffer in batches to reduce power consumption. Additionally, motion processor 610 is configured to perform a numerical integration according to sensor clock 612 to generate a plurality of computing results based on the motion samples fetched. Motion processor 610 then provides less than all of the plurality of computing results to processor 604 of electronic device 602.

For the application of a stereo headset, directional jitter and sound fluctuation may seriously impact user experience. Moreover, the user usually cannot distinguish directional latency for audio sound. Accordingly, the update rate for the processor 604 may be controlled at a reduced rate. However, a higher update rate for generating the computing result can effectively reduce accumulated error. As a result, the motion processor 610 may generate the computing result at a higher rate, while the processor 604 may only retrieve a portion of the computing results at a lower rate. In particular, these computing results may be provided at a polling rate lower than the sampling rate according to processor clock 608. By way of example, the sampling rate may be 100 Hz and the polling rate may be 50 Hz.

In some embodiments, motion processor 610 is configured to use a sampling period corresponding to the sampling rate to perform the numerical integration. In some of these embodiments, motion sensor 606 incorporates a configuration register (e.g., register 616), which is accessed by motion processor 610 to set the sampling rate for motion sensor 606.

Also shown in FIG. 10, motion module 600 may include a processing unit 620 that incorporates processing circuitry 622. Processing unit 620 is coupled to motion processor 610 and is configured to perform polling of motion processor 610 according to processor clock 608. Specifically, processing unit 620 is configured to poll motion processor 610 at a polling rate that is lower than the sampling rate so that, for each polling of motion processor 610, processing unit 620 fetches a portion of the computing results provided by motion processor 610 to perform a preset processing. For instance, motion processor 610 may synchronize with the processor clock 608 to generate a timer. The motion processor 610 switches from the suspend mode to the full operation mode based on the notification from motion sensor 606 when the watermark value has been reached. In full operation mode, the motion processor 610 performs motion sample fetching according to the processor clock 608. The motion processor 610 performs the numerical integration according to the sensor clock 612 to generate the computing result at the sampling rate. The timer sets a time interval according to the polling rate of the processor 604, which is also a reduced ODR for the motion processor 610. The polling rate is lower than the sampling rate, such as 50 Hz. When time interval set by the timer is reached, the motion processor 610 has generated more than the required computing results. The motion processor 610 provides the last computing result to the processor 604 and ignores the rest of the computing results. The processor 604 is also synchronized with the processor clock 608 (or the timer) to read the last computing result and perform a preset processing accordingly. The processor 604 utilizes the computing results, which are provided at the reduced ODR, to reproduce directional audio sound. Moreover, since both the reading of the computing result by processor 604 and the fetching of samples in batch by motion processor 610 are synchronized with the processor clock 608, data loss and time variation can be avoided when the motion processor 610 frequently switches between the suspend mode and full operation mode.

In operation, motion sensor 602 of motion module 600 produces motion samples, and then stores the motion samples in sensor buffer 614 at a sampling rate according to sensor clock 612. Responsive to a sample count of the motion samples stored in sensor buffer 614 corresponding to a watermark value, motion sensor 602 provides a buffer status. In response to the buffer status, motion processor 610 fetches all of the motion samples stored in sensor buffer 614. Then, in response to completion of the fetching, motion processor 610 suspends communication with motion sensor 602. A numerical integration then is performed by motion processor 610 according to sensor clock 612 to generate a plurality of computing results based on the motion samples fetched. In some embodiments, less than all of the plurality of computing results are provided to a processor of the electronic device at a polling rate lower than the sampling rate according to processor clock 608.

Figure 11:
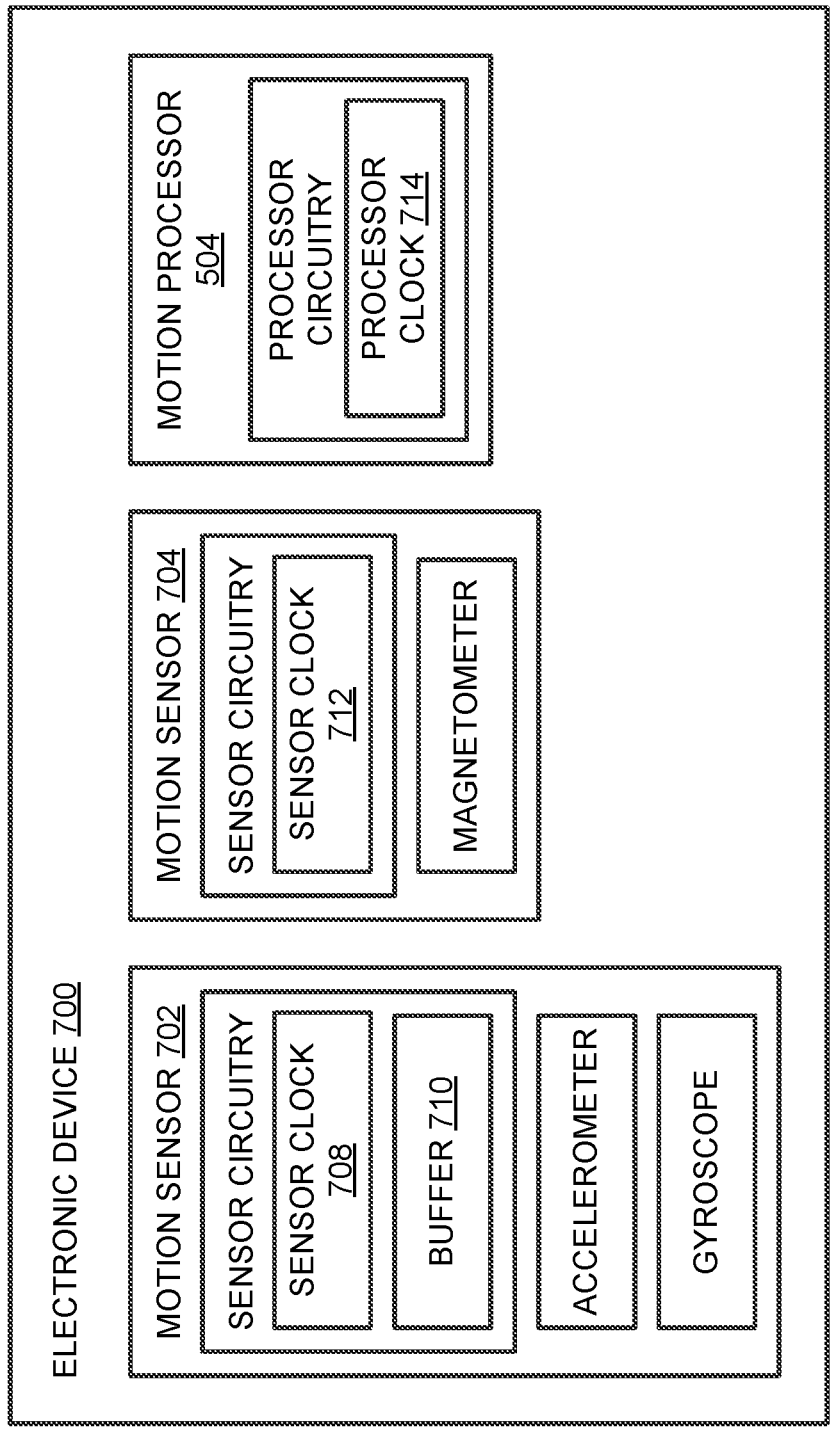
FIG. 11 is a schematic diagram showing an electronic device according to another embodiment of the present application.

FIG. 11 is a schematic diagram showing an electronic device according to another embodiment of the present application. Electronic device 700 of FIG. 11 includes motion sensors (e.g., a first motion sensor 702 and a second motion sensor 704) and a motion processor 706. First motion sensor 702 incorporates sensor circuitry including a first sensor clock 708 and a sensor buffer 710. First motion sensor 702 is configured to produce first motion samples and store the first motion samples in sensor buffer 710 at a first sampling rate according to first sensor clock 708. Second motion sensor 704 also incorporates sensor circuitry including a second sensor clock 712. Second motion sensor 704 is configured to produce second motion samples at a second sampling rate that is lower than the first sampling rate according to second sensor clock 712. Motion processor 706 incorporates processor circuitry including a processor clock 714. Motion processor 706 is coupled to first motion sensor 702 and is configured to poll first motion sensor 702 at a first polling rate lower or equal to the first sampling rate. Motion processor 706 also is coupled to second motion sensor 704 and is configured to poll second motion sensor 704 at a second polling rate according to processor clock 714. Specifically, at each polling of first motion sensor 702, motion processor 706 fetches all of the first motion samples stored in sensor buffer 710. Further, at each polling of second motion sensor 704, motion processor 706 fetches at least one of the second motion samples provided by second motion sensor 704 according to processor clock 714. Additionally, motion processor 706 is configured to perform a numerical integration according to first sensor clock 708 based on the fetched first motion samples and to perform a preset processing based on the second motion samples provided by second motion sensor 704.

In some embodiments, the first motion samples include accelerometer samples and gyroscope samples. So configured, motion processor is able to fetch the accelerometer samples and the gyroscope samples stored in sensor buffer 710 in batches to reduce power consumption of electronic device 700. In some embodiments, first motion sensor 602 incorporates an accelerometer and a gyroscope that provide the accelerometer samples and the gyroscope samples, respectively, at the sampling rate according to first sensor clock 708. Additionally, in some embodiments, second motion sensor 704 is configured as a magnetometer that provides magnetometer samples at the second sampling rate according to second sensor clock 712.

In some embodiments, motion processor 710 uses a first sampling period corresponding to the first sampling rate to perform the numerical integration, with computing results of the numerical integration being optionally provided a remote electronic device at the second polling rate. Motion processor 710 may also use a second sampling period corresponding to the second sampling rate to perform the preset processing.

In operation, electronic device 700 uses first motion sensor 702 to produce first motion samples, which are stored in sensor buffer 710 at a first sampling rate according to first sensor clock 708. Additionally, electronic device 700 uses second motion sensor 704 to produce second motion samples at a second sampling rate, which is lower than the first sampling rate, according to second sensor clock 712. Motion processor 710 performs polling of first motion sensor 702 at a first polling rate, which is lower or equal to the first sampling rate. At each polling of first motion sensor 702, motion processor 710 fetches all of the first motion samples stored in sensor buffer 710. Then, motion processor 710 performs a numerical integration according to first sensor clock 708 based on the fetched first motion samples. Additionally, motion processor 710 performs polling of second motion sensor 704 at a second polling rate according to processor clock 714. At each polling of second motion sensor 704, motion processor 710 fetches at least one of the second motion samples. Then, motion processor 710 performs a preset processing based on the second motion samples provided by second motion sensor 704. By way of example, such a preset processing may include 9-axis sensor fusion computations such as described in U.S. Pat. No. 8,552,978 or method of determining quality of magnetism such as described in U.S. Provisional Patent Application 62/563,773, filed Sep. 27, 2017, the disclosure of each of which being incorporated herein in its entirety.

Figure 12:
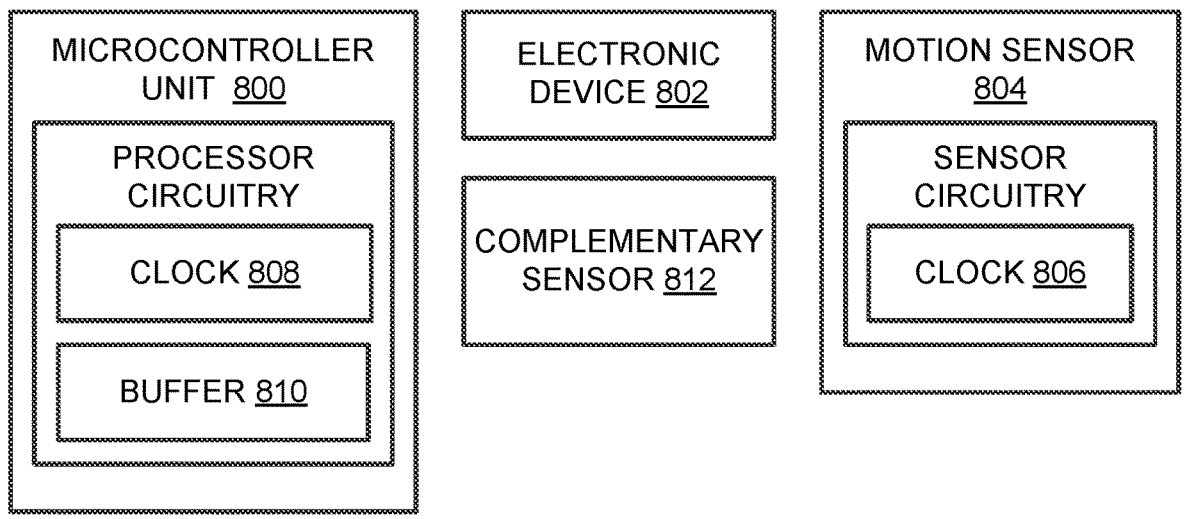
FIG. 12 is a schematic diagram showing a microcontroller unit according to another embodiment of the present application.

FIG. 12 is a schematic diagram showing a microcontroller unit (MCU) according to another embodiment of the present application. As shown in FIG. 12, microcontroller unit 800 is configured for use with an electronic device 802 and a motion sensor 804, which includes a sensor clock 806. Microcontroller unit 800 incorporates processor circuitry, including a processor clock 808 and a processor buffer 810. Microcontroller unit 800 is configured to perform polling of motion sensor 804 periodically to fetch one or more motion samples according to processor clock 808, and store the fetched motion samples in processor buffer 810. Microcontroller unit 800 performs a numerical integration based on the fetched motion samples according to sensor clock 806 of motion sensor 804, and provides a result of the numerical integration to electronic device 802 through a wireless communication link. This may enable the electronic device to track the movement and/or posture of a remote controller to which the microcontroller and the motion sensor 804 are affixed. The electronic device can be a gaming system that provides interactive multimedia content in response to the computing result. Notably, the motion samples include an accelerometer sample and a gyroscope sample. So configured, for each polling of motion sensor 804, microcontroller unit 800 fetches the accelerometer sample and the gyroscope sample in batch to reduce power consumption.

In some embodiments, microcontroller unit 800 sets a sampling rate of motion sensor 804. In particular, microcontroller unit 800 may use a sampling period corresponding to the sampling rate to perform the numerical integration. In some embodiments, microcontroller unit 800 is further configured to: poll a complementary sensor (e.g., sensor 812) periodically to fetch a complementary sample according to processor clock 808; store the fetched complementary sample in processor buffer 810; and, perform a preset processing based on the result of the numerical integration and the complementary sample according to processor clock 808. In some embodiments, the complementary sensor may be a magnetometer which provides magnetometer samples. It should also be noted that one or more of the above-mentioned components may be housed together. By way of example, the microcontroller unit 800, the motion sensor 804, and the complementary sensor 812 can be implemented as a system in package, such as a fusion module which can wirelessly provide orientation information of the module.

In operation, microcontroller unit 800 polls motion sensor 804 periodically to fetch motion samples in batch according to processor clock 808 to reduce power consumption, wherein the motion samples include an accelerometer sample and a gyroscope sample. The fetched motion samples are stored in processor buffer 810. Numerical integration is performed based on the fetched motion samples according to sensor clock 806. Then, a result of the numerical integration is provided to electronic device 802.

Figure 13:
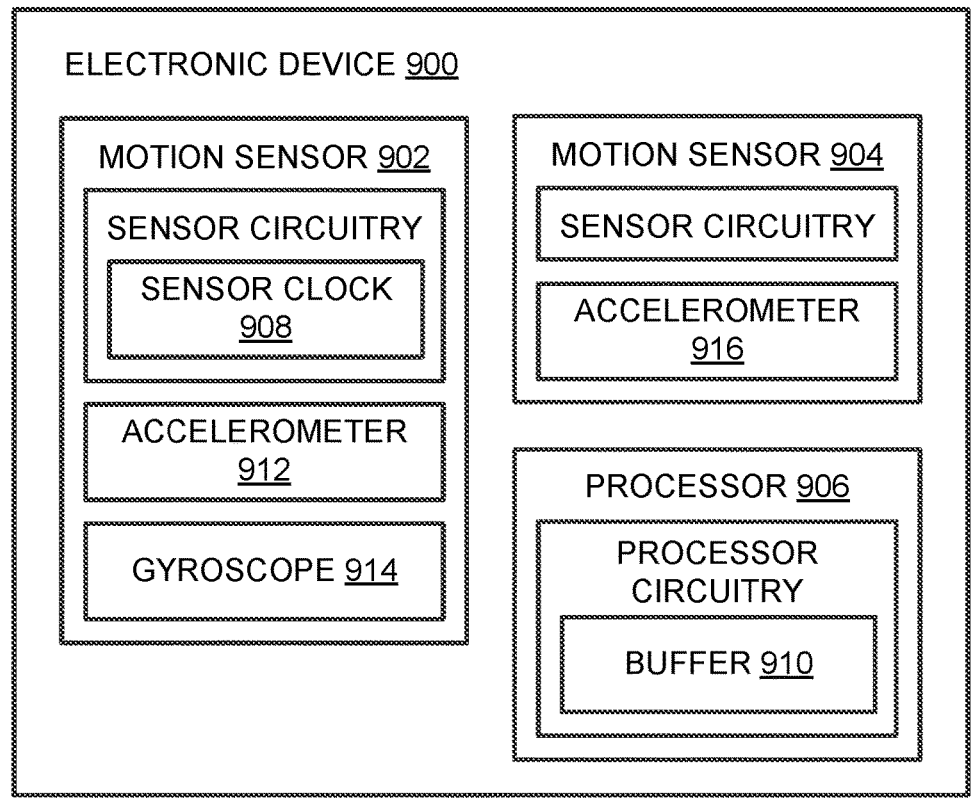
FIG. 13 is a schematic diagram showing an electronic device according to another embodiment of the present application.

FIG. 13 is a schematic diagram showing an electronic device according to another embodiment of the present application. As shown in FIG. 13, electronic device 900 incorporates a first motion sensor 902, a second motion sensor 904, and a processor 906. First motion sensor 902 incorporates sensor circuitry, including a first sensor clock 908. First motion sensor 902 is configured to produce first motion samples and to store a sequence of the first motion samples according to first sensor clock 908. Second motion sensor 904 incorporates sensor circuitry. Second motion sensor 904 is configured to produce second motion samples and to store a sequence of the second motion samples. Processor 906, which incorporates processor circuitry including a processor buffer 910, is configured to selectively perform polling of one of first motion sensor 902 or second motion sensor 904 at a polling rate. For each polling, processor 906 fetches, in batches, the sequence of the first motion samples or the sequence of the second motion samples. So configured, responsive to first motion sensor 902 being polled, processor 906 performs a numerical integration according to first sensor clock 908 based on the fetched sequence of the first motion samples. Additionally, responsive to second motion sensor 904 being polled, processor 906 performs a preset processing based on the fetched sequence of the second motion samples.

In some embodiments, first motion sensor 902 incorporates at least one accelerometer (e.g., a first accelerometer 912), with each being configured to provide corresponding accelerometer samples, and at least one gyroscope (e.g., gyroscope 914), with each being configured to provide corresponding gyroscope samples. In some of these embodiments, the sequence of the first motion samples includes the accelerometer samples and the gyroscope samples, with first motion sensor 902 producing the first motion samples at a first sampling rate according to first sensor clock 908.

In some embodiments, second motion sensor 904 includes at least one accelerometer (e.g., a second accelerometer 916). By way of example, second accelerometer 916 is configured to provide second accelerometer samples. In some of these embodiments, the sequence of second motion samples includes the second accelerometer samples, with second motion sensor 904 producing the second motion samples at a second sampling rate lower or equal to the first sampling rate. It should also be noted that, in some embodiments, the polling rate is lower than the first sampling rate and is lower than the second sampling rate.

In operation, first motion sensor 902 produces first motion samples and then stores a sequence of the first motion samples according to first sensor clock 908. Similarly, second motion sensor 904 produces second motion samples and stores a sequence of the second motion samples. Processor 906 selectively polls one of first motion sensor 902 or second motion sensor 904 at a polling rate and fetches in batches, at each polling, the sequence of the first motion samples or the sequence of the second motion samples. In particular, responsive to first motion sensor 902 being polled, processor 906 performs a numerical integration according to first sensor clock 908 based on the fetched sequence of the first motion samples. Additionally, responsive to second motion sensor 904 being polled, processor 906 performs a preset processing based on the fetched sequence of the second motion samples.

Moreover, the electronic device may further incorporate an external clock and a heart rate sensor. The external clock and the heart rate sensor can be housed inside the electronic device. Because the heart rate sensor may tend to occupy the full computing resources of the processor 906 and introduce data loss when the processor 906 switches to poll other sensors, processor 906 may be configured to synchronize with the external clock for each time when it performs said polling and fetching in batches from one of first motion sensor 902 or second motion sensor 904. Processor 906 is also synchronized with the external clock when reading the heart rate samples.

The first motion sensor 902 may require substantially higher power consumption than the required by second motion sensor 904. The processor 906 in default sets the first motion sensor 902 in a deactivated mode. The processor 906 relays the motion samples from the second motion sensor 904 or hears rate samples from the heart rate sensor, which will be in an activated mode or in the low power mode in default, to determine whether to switch to listen for motion samples from the first motion sensor 902. For example, the processor 906 utilizes the motion samples from the second motion sensor 904 to determine whether the user is in a high activity state. In response to determining that the user is in the high activity state, the processor 906 switches the first motion sensor 902 into the full operation mode or the low power mode from the suspend mode. By utilizing motion samples from the first motion sensor 902, the electronic device can determine a current training type among a schedule of training types, as described in U.S. patent application Ser. No. 15/681,661, filed on Aug. 21, 2017, the disclosure of which is incorporated by reference herein in its entirety.

Figure 14:
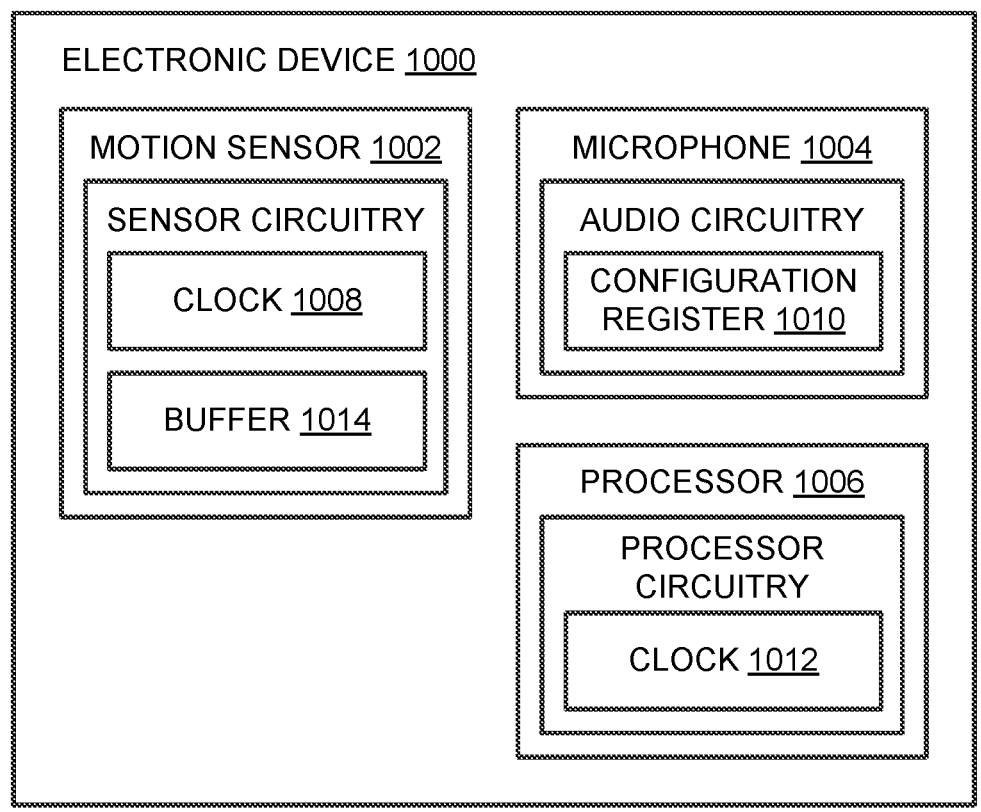
FIG. 14 is a schematic diagram showing an electronic device according to another embodiment of the present application.

FIG. 14 is a schematic diagram showing an electronic device according to another embodiment of the present application. As shown in FIG. 14, electronic device 1000 includes a motion sensor 1002, a microphone 1004, and a processor 1006. Motion sensor 1002 incorporates sensor circuitry including a sensor clock 1008. Motion sensor 1002 is configured to produce motion samples and to store the motion samples according to sensor clock 1008. Microphone 1004 incorporates audio circuitry including a configuration register 1010, which is configured to set a sampling configuration of microphone 1004. Microphone 1004 is configured to produce audio samples based on the sampling configuration. Processor 1006 incorporates processor circuitry including a processor clock 1012. Processor 1006 is configured to: fetch, in batch, all of the stored motion samples; perform a numerical integration or a numerical differentiation according to sensor clock 1008 to generate a first computing result based on the fetched motion samples; and, set the sampling configuration of the microphone based on the first computing result. Processor 1006 also is configured to: store the audio samples produced by microphone 1004 over a time span; perform a preset processing to obtain a second computing result based on the stored audio samples associated with the time span; and, adjust the time span over which the audio samples are to be stored subsequently according to the second computing result.

In some embodiments, such as depicted in FIG. 14, motion sensor 1002 includes a sensor buffer 1014 that is configured to store the motion samples. Additionally, or alternatively, motion sensor 1002 may incorporate (although not depicted in FIG. 14) at least one of an accelerometer configured to provide accelerometer samples or a gyroscope configured to provide gyroscope samples. So configured, motion sensor 1002 may produce a plurality of motion samples including at least one of the accelerometer samples or the gyroscope samples and store the plurality of motion samples in sensor buffer 1014 according to sensor clock

1008. In some embodiments, motion sensor 1002 is configured to provide the motion samples at a sampling rate, with processor 1006 being configured to adjust the sampling rate based on the first computing result.

In operation, motion sensor 1002 produces motion samples that are stored (e.g., stored in sensor buffer 1014) according to sensor clock 1008. A sampling configuration of microphone 1004 is then set according to configuration register 1010, with the microphone being configured to produce audio samples based on the sampling configuration. Processor 1006 fetches all of the stored motion samples in batch and performs a numerical integration or a numerical differentiation according to sensor clock 1008 to generate a first computing result based on the fetched motion samples. The first computing result is then used to set the sampling configuration of microphone 1004. Audio samples produced by microphone 1004 over a time span are stored, and a preset processing is performed to obtain a second computing result based on the stored audio samples associated with the time span. Thereafter, the time span over which the audio samples are to be stored subsequently is adjusted according to the second computing result. For example, the electronic device can be placed tightly around a dog's neck to monitor its barking behavior. When the dog barks, jumps, or suddenly changes head posture, the processor 1006 can use motion samples from the always-on motion sensor 1002. However, motion samples represented by the aforementioned actions usually share similar features, particularly for dogs. Thus, the processor 1006 may not be able to identify actual action of the dog by analyzing the motion samples alone. The processor 1006 can then activate the microphone 1004 by increasing the gain of the microphone circuit so as to obtain audio samples. Moreover, the processor 1006 may buffer a sequence of the audio samples, such as over 5 seconds, to perform voice activity detection for a mid-bandwidth of the audio samples. If the voice activity detection suggests a high possibility of interested features in the mid-bandwidth, the processor 1006 can further increase the time over which the audio samples are buffered. Increasing buffer length may allow the processor 1006 to obtain strength distribution in a wider bandwidth for frequency domain analysis, and the processor 1006 performs a more complicated audio detection over the expanded bandwidth, compared to the mid-bandwidth, to confirm whether a set of interested features can be found. Accordingly, the processor 1006 can confirm the dog barking behavior if the set of interested features has been found.

It will be apparent to those skilled in the art that various modifications and variations can be made to the structure of the present application without departing from the scope or spirit of the invention. In view of the foregoing, it is intended that the present application cover modifications and variations of this invention provided they fall within the scope of the following claims and their equivalents.

What is claimed is:

1. An electronic device, comprising:
   a motion sensor having sensor circuitry including a sensor clock, the motion sensor being configured to provide one or more samples, including at least one of an accelerometer sample or a gyroscope sample associated with the electronic device, at a sampling rate according to the sensor clock, wherein the motion sensor is further configured to store each of the one or more samples in a buffer of the motion sensor; and
   a processor having processor circuitry including a processor clock, the processor being coupled to the motion sensor and configured to perform a polling at a polling rate, wherein for each said polling the processor fetches the samples in batches from the buffer, wherein the processor is further configured to perform a numerical integration according to the sensor clock based on the samples fetched from the buffer.

2. The electronic device of claim 1, wherein:
   the motion sensor has a configuration register; and
   the processor is configured to set the sampling rate of the motion sensor by accessing the configuration register.

3. The electronic device of claim 1, wherein the processor is configured to use less than all of the samples fetched from the buffer to perform the numerical integration.

4. The electronic device of claim 1, wherein the processor is configured to use all of the samples fetched from the buffer to perform the numerical integration.

5. The electronic device of claim 1, wherein the processor is configured to use a sampling period corresponding to the sampling rate to perform the numerical integration.

6. The electronic device of claim 1, wherein the processor lacks a dedicated interrupt pin configured to facilitate fetching of the sample.

7. The electronic device of claim 1, wherein the motion sensor is configured to generate the samples at a rate higher than the sampling rate.

8. A method of motion processing of an electronic device having a motion sensor and a processor, the motion sensor having sensor circuitry including a sensor clock, the processor having processor circuitry including a processor clock, the method comprising:
   providing one or more samples, including at least one of an accelerometer sample or a gyroscope sample associated with the electronic device, by the motion sensor at a sampling rate according to the sensor clock;
   storing each of the one or more samples in a buffer of the motion sensor;
   fetching the samples in batches from the buffer, by the processor, at a polling rate; and
   performing, by the processor, a numerical integration according to the sensor clock based on the samples fetched from the buffer.

9. The method of claim 8, wherein:
   the motion sensor has a configuration register; and
   the method further comprises setting, by the processor, the sampling rate of the motion sensor by accessing the configuration register.

10. The method of claim 8, wherein performing the numerical integration further comprises using less than all of the samples fetched from the buffer to perform the numerical integration.

11. The method of claim 8, wherein performing the numerical integration further comprises using all of the samples fetched from the buffer to perform the numerical integration.

12. The method of claim 8, wherein performing the numerical integration further comprises using a sampling period corresponding to the sampling rate to perform the numerical integration.

13. The method of claim 8, wherein the processor lacks a dedicated interrupt pin configured to facilitate fetching of the sample.

14. The method of claim 8, further comprising generating, by the motion sensor, the samples at a rate higher than the sampling rate.

15. A motion module for use with an electronic device having a processor, the motion module comprising:

a motion sensor having sensor circuitry including a sensor clock and a sensor buffer, the motion sensor being configured to produce motion samples and store the motion samples in the sensor buffer at a sampling rate according to the sensor clock, wherein the motion sensor is further configured to provide a buffer status responsive to a sample count of the motion sample stored in the sensor buffer corresponding to a watermark value;

a processor clock different from the sensor clock; and a motion processor having processor circuitry, the motion processor being coupled to the motion sensor and configured to perform fetching of all of the motion samples stored in the sensor buffer in response to the buffer status and to suspend communicating with the motion sensor in response to completion of the fetching, wherein the motion processor is further configured to perform a numerical integration according to the sensor clock to generate a plurality of computing results based on the motion samples fetched, and to provide less than all of the plurality of computing results to the processor of the electronic device at a polling rate lower than the sampling rate according to the processor clock.

16. The electronic device of claim 15, wherein the motion samples include accelerometer samples and gyroscope samples, and the motion processor is configured to fetch in batches the accelerometer samples and the gyroscope samples stored in the sensor buffer to reduce power consumption.

17. The electronic device of claim 16, wherein the motion sensor comprises an accelerometer, configured to provide the accelerometer samples at the sampling rate according to the sensor clock, and a gyroscope, configured to provide the gyroscope samples at the sampling rate according to the sensor clock.

18. The electronic device of claim 15, wherein the motion processor is configured to use a sampling period corresponding to the sampling rate to perform the numerical integration.

19. The electronic device of claim 15, wherein:
the sensor buffer is located inside a housing of the motion sensor;
the motion sensor has a configuration register; and
the motion processor is configured to set the sampling rate for the motion sensor by accessing the configuration register.

20. The electronic device of claim 15, further comprising:
a processing unit having processing circuitry, coupled to the motion processor, configured to perform polling of the motion processor according to the processor clock, wherein the processing unit is configured to poll the motion processor at a polling rate lower than the sampling rate, and wherein in said polling the processing unit is configured to fetch a portion of computing results provided by the motion processor to perform a preset processing.

21. A method of motion processing of a motion module for use with an electronic device having a processor, the motion module having sensor circuitry, including a sensor clock and a sensor buffer, a processor clock different from the sensor clock, and a motion processor having processor circuitry, the method comprising:
producing motion samples by the motion sensor;
storing the motion samples in the sensor buffer at a sampling rate according to the sensor clock;

providing, by the motion sensor, a buffer status responsive to a sample count of the motion sample stored in the sensor buffer corresponding to a watermark value;

fetching, by the motion processor, all of the motion samples stored in the sensor buffer in response to the buffer status;

suspending communication with the motion sensor, by the motion processor, in response to completion of the fetching;

performing, by the motion processor, a numerical integration according to the sensor clock to generate a plurality of computing results based on the motion samples fetched; and providing less than all of the plurality of computing results to the processor of the electronic device at a polling rate lower than the sampling rate according to the processor clock.

22. The method of claim 21, wherein:
the motion samples include accelerometer samples and gyroscope samples;
fetching all of the motion samples further comprises fetching the accelerometer samples and the gyroscope samples stored in the sensor buffer in batches to reduce power consumption.

23. The method of claim 22, wherein the motion sensor comprises an accelerometer, configured to provide the accelerometer samples at the sampling rate according to the sensor clock, and a gyroscope, configured to provide the gyroscope samples at the sampling rate according to the sensor clock.

24. The method of claim 21, wherein performing the numerical integration further comprises using, by the motion processor, a sampling period corresponding to the sampling rate to perform the numerical integration.

25. The method of claim 21, wherein:
the motion sensor has a configuration register; and
the method further comprises setting, by the motion processor, the sampling rate for the motion sensor by accessing the configuration register.

26. The method of claim 21, further comprising:
providing a processing unit having processing circuitry, coupled to the motion processor;
polling the motion processor by the processing unit according to the processor clock at a polling rate lower than the sampling rate; and
fetching, by the motion processor, a portion of computing results provided by the motion processor based on the polling to perform a preset processing.

27. An electronic device, comprising:
a first motion sensor having sensor circuitry including a first sensor clock and a sensor buffer, the first motion sensor being configured to produce first motion samples and store the first motion samples in the sensor buffer at a first sampling rate according to the first sensor clock;

a second motion sensor having sensor circuitry including a second sensor clock, the second motion sensor being configured to produce second motion samples at a second sampling rate lower than the first sampling rate according to the second sensor clock; and a motion processor having processor circuitry including a processor clock, the motion processor being coupled to the first motion sensor and second motion sensor, the motion processor being configured to poll the first motion sensor at a first polling rate lower or equal to the first sampling rate and to poll the second motion sensor at a second polling rate according to the processor clock, wherein in each said polling of the first motion sensor the motion processor fetches all of the first motion samples stored in the sensor buffer, and in each said polling of the second motion sensor the motion processor fetches at least one of the second motion samples provided by the second motion sensor according to the processor clock, wherein the motion processor is further configured to perform a numerical integration according to the first sensor clock based on the fetched first motion samples and to perform a preset processing based on the second motion samples provided by the second motion sensor.

28. The electronic device of claim 27, wherein the first motion samples include accelerometer samples and gyroscope samples, and the motion processor is configured to fetch in batches the accelerometer samples and the gyroscope samples stored in the sensor buffer to reduce power consumption.

29. The electronic device of claim 28, wherein the first motion sensor comprises an accelerometer, configured to provide the accelerometer samples at the sampling rate according to the first sensor clock, and a gyroscope, configured to provide the gyroscope samples at the sampling rate according to the first sensor clock.

30. The electronic device of claim 27, wherein:
the second motion samples includes magnetometer samples; and
the second motion sensor comprises a magnetometer configured to provide the magnetometer samples at the second sampling rate according to the second sensor clock.

31. The electronic device of claim 27, wherein the motion processor is configured to use a first sampling period corresponding to the first sampling rate to perform the numerical integration and to use a second sampling period corresponding to the second sampling rate to perform the preset processing.

32. The electronic device of claim 27, wherein the motion processor is configured to provide a remote electronic device with computing results of the numerical integration at the second polling rate.

33. A method of motion processing of an electronic device having a first motion sensor, a second motion sensor, and a motion processor, the first motion sensor having sensor circuitry including a first sensor clock and a sensor buffer, the second motion sensor having sensor circuitry including a second sensor clock, the motion processor having processor circuitry including a processor clock, the method comprising:
producing, by the first motion sensor, first motion samples;
storing the first motion samples in the sensor buffer at a first sampling rate according to the first sensor clock;
producing, by the second motion sensor, second motion samples at a second sampling rate lower than the first sampling rate according to the second sensor clock;
polling, by the motion processor, the first motion sensor at a first polling rate lower or equal to the first sampling rate;
fetching, by the motion processor, all of the first motion samples stored in the sensor buffer at each said polling of the first motion sensor;
polling, by the motion processor, the second motion sensor at a second polling rate according to the processor clock;
fetching, by the motion processor, at least one of the second motion samples at each said polling of the second motion sensor;
performing, by the motion processor, a numerical integration according to the first sensor clock based on the fetched first motion samples; and
performing, by the motion processor, a preset processing based on the second motion samples provided by the second motion sensor.

34. The method of claim 33, wherein:
the first motion samples include accelerometer samples and gyroscope samples;
fetching all of the first motion samples further comprises the motion processor fetching the accelerometer samples and the gyroscope samples stored in the sensor buffer in batches to reduce power consumption.

35. The method of claim 34, wherein the first motion sensor comprises an accelerometer, configured to provide the accelerometer samples at the sampling rate according to the first sensor clock, and a gyroscope, configured to provide the gyroscope samples at the sampling rate according to the first sensor clock.

36. The method of claim 33, wherein:
the second motion samples includes magnetometer samples; and
the second motion sensor comprises a magnetometer configured to generate the magnetometer samples at the second sampling rate according to the second sensor clock.

37. The method of claim 33, wherein:
performing the numerical integration further comprises using a first sampling period corresponding to the first sampling rate to perform the numerical integration; and
performing the preset processing further comprises using a second sampling period corresponding to the second sampling rate to perform the preset processing.

38. The method of claim 33, further comprising providing, by the motion processor, a remote electronic device with computing results of the numerical integration at the second polling rate.

39. A microcontroller unit for use with an electronic device and a motion sensor having a sensor clock, the microcontroller unit comprising:
processor circuitry including a processor clock and a processor buffer;
wherein the microcontroller unit is configured to:
perform polling of the motion sensor periodically to fetch one or more motion samples according to the processor clock;
store the fetched motion samples in the processor buffer;
perform a numerical integration based on the fetched motion samples according to the sensor clock of the motion sensor; and
provide a result of the numerical integration to the electronic device;
wherein the motion samples include an accelerometer sample and a gyroscope sample, and in each said polling the microcontroller unit fetches in batch the accelerometer sample and the gyroscope sample to reduce power consumption.

40. The microcontroller unit of claim 39, wherein the microcontroller unit is further configured to set a sampling rate of the motion sensor.

41. The microcontroller unit of claim 40, wherein the microcontroller unit is further configured to use a sampling period corresponding to the sampling rate to perform the numerical integration.

42. The microcontroller unit of claim 39, wherein the microcontroller unit is further configured to:
poll a complementary sensor periodically to fetch a complementary sample according to the processor clock;
store the fetched complementary sample in the processor buffer; and
perform a preset processing based on the result of the numerical integration and the complementary sample according to the processor clock.

43. A method of motion processing of a microcontroller unit for use with an electronic device and a motion sensor having a sensor clock, the microcontroller unit having processor circuitry including a processor clock and a processor buffer, the method comprising:
polling, by the microcontroller unit, the motion sensor periodically to fetch motion samples in batch according to the processor clock to reduce power consumption, wherein the motion samples include an accelerometer sample and a gyroscope sample;
storing the fetched motion samples in the processor buffer;
performing a numerical integration based on the fetched motion samples according to the sensor clock of the motion sensor; and
providing a result of the numerical integration to the electronic device.

44. The method of claim 43, further comprising setting, by the microcontroller unit, a sampling rate of the motion sensor.

45. The method of claim 44, wherein performing the numerical integration further comprises using, by the microcontroller unit, a sampling period corresponding to the sampling rate to perform the numerical integration.

46. The method of claim 43, further comprising:
polling, by the microcontroller unit, a complementary sensor periodically to fetch a complementary sample according to the processor clock;
storing the fetched complementary sample in the processor buffer; and
performing, by the microcontroller unit, a preset processing based on the result of the numerical integration and the complementary sample according to the processor clock.

47. An electronic device, comprising:
a first motion sensor having sensor circuitry including a first sensor clock, the first motion sensor being configured to produce first motion samples and to store a sequence of the first motion samples according to the first sensor clock;
a second motion sensor having sensor circuitry, the second motion sensor being configured to produce second motion samples and to store a sequence of the second motion samples; and
a processor, having processor circuitry including a processor buffer, configured to:
selectively perform polling of one of the first motion sensor or the second motion sensor at a polling rate, wherein in each said polling the processor fetches in batches the sequence of the first motion samples or the sequence of the second motion samples;
wherein, responsive to the first motion sensor being polled, the processor is configured to perform a numerical integration according to the sensor clock based on the fetched sequence of the first motion samples; and
wherein, responsive to the second motion sensor being polled, the processor is configured to perform a preset processing based on the fetched sequence of the second motion samples.

48. The electronic device of claim 47, wherein:
the first motion sensor includes a first accelerometer configured to provide first accelerometer samples and a gyroscope configured to provide gyroscope samples;
the sequence of the first motion samples includes the accelerometer samples and the gyroscope samples;
the first motion sensor is configured to produce the first motion samples at a first sampling rate according to the first sensor clock.

49. The electronic device of claim 48, wherein:
the second motion sensor includes a second accelerometer configured to provide second accelerometer samples;
the sequence of second motion samples includes the second accelerometer samples; and
the second motion sensor is configured to produce the second motion samples at a second sampling rate lower or equal to the first sampling rate.

50. The electronic device of claim 49, wherein the polling rate is lower than the first sampling rate and is lower than the second sampling rate.

51. A method of motion processing of an electronic device having a first motion sensor, a second motion sensor, and a processor, the first motion sensor having sensor circuitry including a first sensor clock, the second motion sensor having sensor circuitry, the processor having processor circuitry including a processor buffer, the method comprising:
producing, by the first motion sensor, first motion samples;
storing, by the first motion sensor, a sequence of the first motion samples according to the first sensor clock;
producing, by the second motion sensor, second motion samples;
storing, by the second motion sensor, a sequence of the second motion samples; and
selectively polling, by the processor, one of the first motion sensor or the second motion sensor at a polling rate, wherein in each said polling the processor fetches in batches the sequence of the first motion samples or the sequence of the second motion samples;
responsive to the first motion sensor being polled, performing a numerical integration by the processor according to the first sensor clock based on the fetched sequence of the first motion samples; and
responsive to the second motion sensor being polled, performing a preset processing by the processor based on the fetched sequence of the second motion samples.

52. The method of claim 51, wherein:
the first motion sensor includes a first accelerometer configured to provide first accelerometer samples and a gyroscope configured to provide gyroscope samples;
the sequence of the first motion samples includes the accelerometer samples and the gyroscope samples;
producing the first motion samples further comprises producing the first motion samples at a first sampling rate according to the first sensor clock.

53. The method of claim 52, wherein:
the second motion sensor includes a second accelerometer configured to provide second accelerometer samples;

the sequence of second motion samples includes the second accelerometer samples; and
producing the second motion samples further comprises producing the second motion samples at a second sampling rate lower or equal to the first sampling rate.

54. The method of claim 53, wherein the polling rate is lower than the first sampling rate and is lower than the second sampling rate.

55. An electronic device, comprising:
a motion sensor having sensor circuitry including a sensor clock, the motion sensor being configured to produce motion samples and to store the motion samples according to the sensor clock;
a microphone having audio circuitry including a configuration register configured to set a sampling configuration of the microphone, the microphone being configured to produce audio samples based on the sampling configuration;
a processor, having processor circuitry including a processor clock, the processor being configured to:
fetch all of the motion samples stored in the sensor buffer in batch;
perform a numerical integration or a numerical differentiation according to the sensor clock to generate a first computing result based on the fetched motion samples;
set the sampling configuration of the microphone based on the first computing result;
store the audio samples produced by the microphone over a time span;
perform a preset processing to obtain a second computing result based on the stored audio samples associated with the time span; and
adjust the time span over which the audio samples are to be stored subsequently according to the second computing result.

56. The electronic device of claim 55, wherein:
the motion sensor comprises a sensor buffer and at least one of an accelerometer configured to provide accelerometer samples or a gyroscope configured to provide gyroscope samples;
the motion sensor is configured to produce a plurality of motion samples including at least one of the accelerometer samples or the gyroscope samples and to store the plurality of motion samples in the sensor buffer according to the sensor clock.

57. The electronic device of claim 55, wherein:
the motion sensor is configured to provide the motion samples at a sampling rate; and
the processor is configured to adjust the sampling rate based on the first computing result.

58. A method of motion processing of an electronic device having a motion sensor, a microphone, and a processor, the motion sensor having sensor circuitry including a sensor clock, the microphone having sensor circuitry including a configuration register, the processor, having processor circuitry including a processor clock, the method comprising:
producing, by the motion sensor, motion samples;
storing, by the motion sensor, the motion samples according to the sensor clock;
setting a sampling configuration of the microphone according to the configuration register, the microphone being configured to produce audio samples based on the sampling configuration;
fetching, by the processor, all of the stored motion samples in batch;
performing, by the processor, a numerical integration or a numerical differentiation according to the sensor clock to generate a first computing result based on the fetched motion samples;
setting the sampling configuration of the microphone based on the first computing result;
storing the audio samples produced by the microphone over a time span;
performing a preset processing to obtain a second computing result based on the stored audio samples associated with the time span; and
adjusting the time span over which the audio samples are to be stored subsequently according to the second computing result.

59. The method of claim 58, wherein:
the motion sensor comprises a sensor buffer and at least one of an accelerometer configured to provide accelerometer samples or a gyroscope configured to provide gyroscope samples;
producing the motion samples further comprises producing a plurality of motion samples including at least one of the accelerometer samples or the gyroscope samples; and
storing the motion samples further comprises storing the plurality of motion samples in the sensor buffer according to the sensor clock.

60. The method of claim 58, wherein:
the motion sensor is configured to provide the motion samples at a sampling rate; and
the method further comprises adjusting the sampling rate by the processor based on the first computing result.

* * * * *